US008874978B2

(12) United States Patent
Hirairi

(10) Patent No.: US 8,874,978 B2
(45) Date of Patent: Oct. 28, 2014

(54) INFORMATION PROCESSING APPARATUS, INFORMATION PROCESSING SYSTEM, CONTROLLING METHOD FOR INFORMATION PROCESSING APPARATUS AND PROGRAM

(75) Inventor: Koji Hirairi, Kanagawa (JP)

(73) Assignee: Sony Corporation, Tokyo (JP)

( * ) Notice: Subject to any disclaimer, the term of this patent is extended or adjusted under 35 U.S.C. 154(b) by 336 days.

(21) Appl. No.: 13/416,431

(22) Filed: Mar. 9, 2012

(65) Prior Publication Data
US 2012/0254676 A1 Oct. 4, 2012

(30) Foreign Application Priority Data

Mar. 31, 2011 (JP) ................................. 2011-077214

(51) Int. Cl.
| | |
|---|---|
| G06F 11/00 | (2006.01) |
| G01R 31/30 | (2006.01) |
| H03M 13/00 | (2006.01) |
| G06F 11/10 | (2006.01) |
| G06F 1/32 | (2006.01) |
| G06F 11/07 | (2006.01) |
| H04L 1/20 | (2006.01) |
| G01R 31/317 | (2006.01) |
| G01R 31/3181 | (2006.01) |
| H03M 13/09 | (2006.01) |

(52) U.S. Cl.
CPC ............ G06F 11/1008 (2013.01); *H04L 1/203* (2013.01); *G01R 31/3171* (2013.01); *G01R 31/31816* (2013.01); G06F 1/324 (2013.01); G06F 1/3296 (2013.01); G06F 11/076 (2013.01); *H03M 13/09* (2013.01)
USPC ............ 714/704; 714/706; 714/745; 714/799

(58) Field of Classification Search
CPC ... G06F 11/1008; G06F 1/324; G06F 1/3296; G06F 11/076; H03M 13/09; G01R 31/3171; G01R 31/31816; H04L 1/203
USPC .......................... 714/704, 706, 745, 758, 799
See application file for complete search history.

(56) References Cited

U.S. PATENT DOCUMENTS 6,802,033 B1 * 10/2004 Bertin et al. .................. 714/704
6,831,523 B1 * 12/2004 Pastorello et al. ............... 331/25
(Continued)

OTHER PUBLICATIONS

Miskov-Zivanov, N.; Marculescu, D., "Modeling and Optimization for Soft-Error Reliability of Sequential Circuits," Computer-Aided Design of Integrated Circuits and Systems, IEEE Transactions on , vol. 27, No. 5, pp. 803,816, May 2008.*

(Continued)

*Primary Examiner* — Cynthia Britt
(74) *Attorney, Agent, or Firm* — Rader, Fishman & Grauer PLLC

(57) ABSTRACT

An information processing apparatus includes a first parity production section for producing a first error detection code for detecting an error of data. A second parity production section produces a second error detection code for detecting an error of the data from the first error detection code. A first parity checking section detects an error of the retained data as a first error using the retained first error detection code. A second parity checking section detects an error of the retained data as a second error using the retained second error detection code. A control amount outputting section outputs, when an occurrence rate of a first error is equal to or lower than a first threshold value, a control amount for controlling a power supply voltage or a frequency using a second threshold value as a target value for an occurrence rate of a second error.

20 Claims, 35 Drawing Sheets

(56) References Cited

U.S. PATENT DOCUMENTS 6,988,227 B1 * 1/2006 Perrott ............................ 714/704
7,124,332 B2 * 10/2006 Constantinescu ................ 714/52
8,499,206 B2 * 7/2013 Cho et al. ........................ 714/708

OTHER PUBLICATIONS

Yi-Ming Lin; Wan-Ching Liu; Li-Yuan Chang; Chih-Yuan Lien; Pei-Yin Chen; Shung-Chih Chen, "A low-power IP design of Viterbi decoder with dynamic threshold setting," Circuits and Systems (ISCAS), Proceedings of 2010 IEEE International Symposium on , vol., No., pp. 585,588, May 30, 2010-Jun. 2, 2010.*

Jingcheng Zhuang; Qingjin Du; Kwasniewski, T., "An eye detection technique for clock and data recovery applications," Circuits and Systems, 2006. ISCAS 2006. Proceedings. 2006 IEEE International Symposium on , vol., No., pp. 4 pp. 5162, May 21-24, 2006.*

* cited by examiner

FIG.5

| CLASSIFICATION IN TIME SLICE | VALUE OF DOWN COUNTER | SLICE START FLAG | VOLTAGE CONTROL FLAG |
|---|---|---|---|
| STANDBY CYCLE | 128~127 | 0 | 0 |
| SLICE START CYCLE | 126 | 1 | |
| VOLTAGE CONTROL AMOUNT CALCULATION CYCLE | 125~120 | | |
| VOLTAGE CONTROL AMOUNT SUPPLYING CYCLE | 119~64 | 0 | 1 |
| STANDBY CYCLE | 63~0 | | 0 |

FIG.6

| SECOND ERROR NUMBER E2 | OUTPUT VALUE OF LOGARITHM ARITHMETIC OPERATION SECTION ($\simeq \log_2 E2$) |
|---|---|
| 00000000 | 000 |
| 00000001 | |
| 0000001X | 001 |
| 000001XX | 010 |
| 00001XXX | 011 |
| 0001XXXX | 100 |
| 001XXXXX | 101 |
| 01XXXXXX | 110 |
| 1XXXXXXX | 111 |

F I G . 8
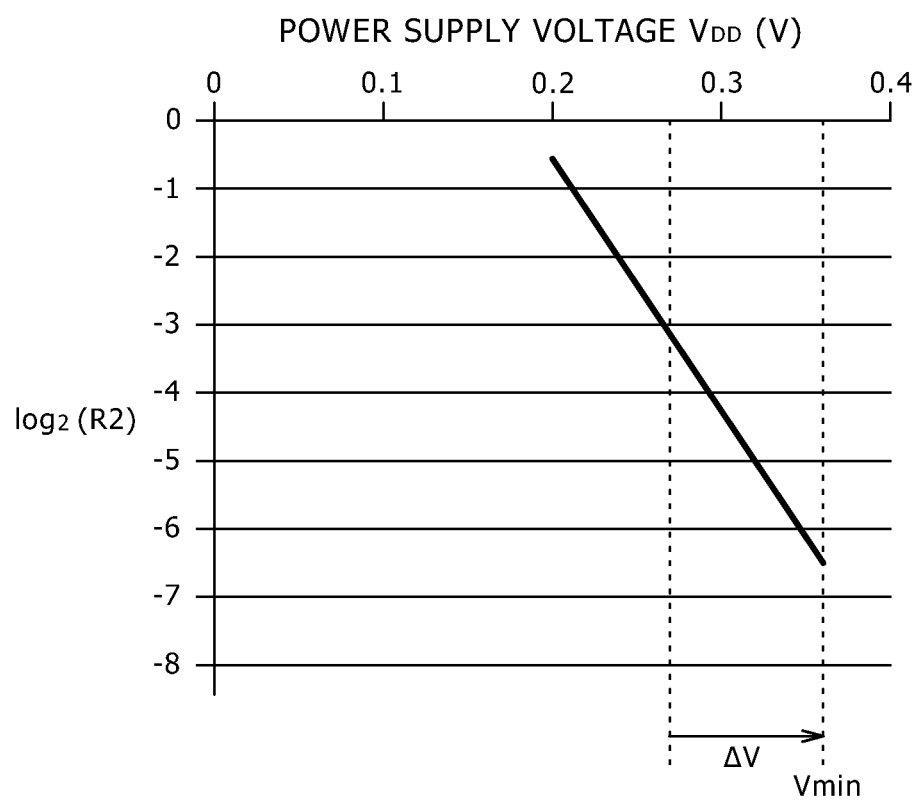

FIG.10

| OUTPUT VALUE OF LOGARITHM ARITHMETIC OPERATION SECTION (BINARY NUMBER) | ERROR NON-DETECTED STATE CONTINUATION FLAG | VOLTAGE CONTROL AMOUNT ΔV (BINARY NUMBER WITH SIGN) |
|---|---|---|
| 000 | 0 | 0000 |
| | 1 | 1111 (STEP-DOWN SET VALUE) |
| 001 | x | 0001 |
| 010 | x | 0010 |
| 011 | x | 0011 |
| 100 | x | 0100 |
| 101 | x | 0101 |
| 110 | x | 0110 |
| 111 | x | 0111 |

FIG.21

| CAUSE OF MALFUNCTION | | DYNAMIC TECHNIQUE FOR ERROR RELAXATION | | STATIC TECHNIQUE FOR ERROR RELAXATION (DESIGN CONSTRAINT METHOD) |
|---|---|---|---|---|
| | | SLOW DOWN OPERATION FREQUENCY | RAISE POWER SUPPLY VOLTAGE | |
| TIMING VIOLATIVE ERROR | SETUP VIOLATIVE ERROR | ○ | ○ | SETUP MARGIN INCREASE |
| | HOLD VIOLATIVE ERROR | × | △ | HOLD MARGIN INCREASE |
| | MINIMUM PULSE WIDTH VIOLATIVE ERROR | ○ | ○ | CLOCK DUTY CONSTRAINT |
| F/F RETENTIVE ERROR | | × | ○ | F/F TRANSISTOR SIZE LARGE |
| LOGIC GATE DC TRANSFER CHARACTERISTIC ERROR | | × | ○ | LOGIC GATE SIZE LARGE |

FIG.22

| CAUSE OF MALFUNCTION | | ERRORS WHICH CAN BE HANDLED | | |
|---|---|---|---|---|
| | | DISCLOSED TECHNOLOGY | TRC AND EDS | TD CIRCUIT |
| TIMING VIOLATIVE ERROR | SETUP VIOLATIVE ERROR | ○ | ○ | ○ |
| | HOLD VIOLATIVE ERROR | ○ | × | ○ |
| | MINIMUM PULSE WIDTH VIOLATIVE ERROR | ○ | × | × |
| F/F RETENTIVE ERROR | | ○ | × | × |
| LOGIC GATE DC TRANSFER CHARACTERISTIC ERROR | | ○ | × | × |

INFORMATION PROCESSING APPARATUS, INFORMATION PROCESSING SYSTEM, CONTROLLING METHOD FOR INFORMATION PROCESSING APPARATUS AND PROGRAM

BACKGROUND

This technology relates to an information processing apparatus, an information processing system, a controlling method for an information processing apparatus and a program, and more particularly to an information processing apparatus, an information processing system, a controlling method for an information processing apparatus and a program wherein a power supply voltage or a frequency is controlled.

In recent years, for a logic circuit for use with a microprocessor or the like, it is often demanded to improve the arithmetic operation process efficiency with respect to power consumption. As a method which improves the arithmetic operation process efficiency by dynamic control without changing the layout of a logic circuit, a method of lowering the power supply voltage while an operating frequency is kept fixed and another method of increasing the frequency while the power supply voltage is kept fixed are available. However, it is known that, when the power supply voltage is lowered or when the frequency is raised, the probability that the logic circuit may malfunction increases.

Errors which make a cause of a malfunction of a logic circuit can be classified into timing violative errors and other errors. A timing violative error is an error caused by displacement of a response timing of the circuit from within an assumed range upon setting.

The errors other than the timing violative errors include an F/F retentive error. The F/F retentive error is an error which occurs because the period for which a flip-flop retains the same value becomes shorter than a value designed therefor.

Since the relationship between the occurrence frequency of such errors and the power supply voltage or frequency varies among various logic circuits, it is difficult to accurately predict a power supply voltage or a frequency across which the error occurrence rate becomes lower than an allowance therefor.

In order to predict a power supply voltage or a frequency across which the occurrence rate of the errors becomes lower than an allowance, it is necessary to investigate the error occurrence rate for each power supply voltage or each frequency on a logic circuit. As a method for detecting an error, a method wherein an EDS (Error Decision Sequentials) and a TRC (Tunable Replica Circuit) are used has been proposed, for example, in James Tschanz et al., "A 45 nm Resilient and Adaptive Microprocessor Core for Dynamic Variation Tolerance," ISSCC 2010. The EDS is a special flip-flop which can detect a timing violative error. The TRC is a circuit wherein inverters are connected such that a delay in a critical path of a logic circuit is imitated so that a data signal delayed by the delay amount is outputted. If a data signal outputted from the TRC is inputted to the EDS and a result of detection of a timing violative error by the EDS is referred to, then presence or absence of occurrence of a timing violative error in the critical path can be predicted.

Further, also a method wherein a TD (Timing-Detector) circuit is used in order to detect an error has been proposed, for example, in David Bull et al., "A Power-Efficient 32b ARM ISA Processor Using Timing-Error Detection and Correction for Transient-Error Tolerance and Adaptation to PVT Variation," ISSCC 2010. The TD circuit detects a rising edge and a falling edge of a data signal to produce a pulse signal and compares production timings of such pulse signals and transition timings of a clock signal with each other to detect an error. A timing violative error in a logic circuit is detected by the TD circuit.

By detecting an error for each of operation conditions in which the power supply voltage or the frequency differs using an EDS and a TRC or a TD circuit, a value of the power supply voltage or the frequency across which the error occurrence frequency becomes lower than an allowance therefor is determined.

SUMMARY

However, with the techniques disclosed in the documents mentioned hereinabove, it is difficult to set an accurate value of a power supply voltage or a frequency with which no malfunction occurs to an information processing apparatus.

With a method wherein an EDS and a TRC or a TD circuit is used, although a timing violative error can be detected, any other error such as, for example, an F/F retentive error cannot be detected. Therefore, it is difficult to obtain an accurate value of a power supply voltage or an operating frequency with which a malfunction does not occur with a circuit in which errors other than timing violative errors occur in a high frequency. Further, the EDS and the TD circuit include a flip-flop. Therefore, where an EDS or a TD circuit is provided, errors such as an F/F retentive error which possibly occur with a flip-flop sometimes increase contrarily. Further, although the EDS and the TRC observe only a path predicted to become a critical path, a delay in a path other than the predicted path may possibly become critical. In this instance, the value of the power supply voltage or the operating frequency obtained from a result of error detection is inaccurate. If all paths are determined as an object of observation in order to obtain an accurate value, then an EDS and a TRC of a very large circuit scale are required, resulting in significant increase in labor and cost. Similarly, also with regard to the TD circuit, as the scale of a circuit of an observation object increases, the number of necessary TD circuits increases, and much labor and a high cost are required to obtain an accurate value of the power supply voltage or the operating frequency.

Even if the EDS and TRC or the TD circuit is not used, errors can be detected readily and simply by carrying out a parity check or the like. However, when such a significant delay that production of a parity bit cannot be carried out in time occurs, a circuit which carries out a parity check or the like cannot always detect a timing violative error caused by the delay.

Accordingly, with the method which uses an EDS and a TRC or a TD circuit or the method which carries out a parity check or the like, it is difficult to obtain an accurate value of a power supply voltage or an operating frequency with which a malfunction does not occur.

Therefore, it is desirable to provide a technique which facilitates setting of an accurate value of a power supply voltage or an operating frequency with which a malfunction does not occur to an information processing apparatus.

According to an embodiment of the technology disclosed herein, there is provided an information processing apparatus including: a first retention section adapted to retain and output data in accordance with a clock signal; a processing section adapted to process the outputted data and output the data as processed data; a first error detection code production section adapted to produce a first error detection code for detecting an error of the processed data from the processed data; a second error detection code production section adapted to produce a second error detection code for detecting an error of the processed data from the first error detection code; a second retention section adapted to retain the processed data and the first and second error detection codes therein in accordance with the clock signal; and a first error detection section adapted to detect an error of the retained processed data as a first error using the retained first error detection code. The information processing apparatus further includes; a second error detection section adapted to detect an error of the retained processed data as a second error using the retained second error detection code; and a control amount outputting section adapted to control, when an occurrence rate of the first error in the first error detection section is equal to or lower than a first threshold value while an occurrence rate of the second error in the second error detection section is higher than a second threshold value, a power supply voltage to the processing section or a frequency of the clock signal using the second threshold value as a target value for the occurrence rate of the second error based on a predetermined relationship between the occurrence rate of the second error and the power supply voltage or the frequency.

According to the embodiment, also there is provided a controlling method for an information processing apparatus, including: producing a first error detection code for detecting an error of processed data processed by a processing section from the processed data; producing a second error detection code for detecting an error of the processed data from the first error detection code; detecting, using the first error detection code retained in a retention section for retaining the processed data and the first and second error detection codes in accordance with a clock signal, an error of the retained processed data as a first error; detecting an error of the retained processed data as a second error using the retained second error detection code; and controlling, when an occurrence rate of the first error by a first error detection section is equal to or lower than a first threshold value while an occurrence rate of the second error by a second error detection section is higher than a second threshold value, a control amount for controlling a power supply voltage to the processing section or a frequency of the clock signal using the second threshold value as a target value for the occurrence rate of the second error based on a predetermined relationship between the occurrence rate of the second error and the power supply voltage or the frequency.

According to the embodiment, also there is provided a program for causing a computer to execute: a first error detection code production step of producing a first error detection code for detecting an error of processed data processed by a processing section from the processed data; a second error detection code production step of producing a second error detection code for detecting an error of the processed data from the first error detection code; a first error detection step of detecting, using the first error detection code retained in a retention section for retaining the processed data and the first and second error detection codes in accordance with a clock signal, an error of the retained processed data as a first error; a second error detection step of detecting an error of the retained processed data as a second error using the retained second error detection code; and a control amount outputting step of controlling, when an occurrence rate of the first error by a first error detection section is equal to or lower than a first threshold value while an occurrence rate of the second error by a second error detection section is higher than a second threshold value, a control amount for controlling a power supply voltage to the processing section or a frequency of the clock signal using the second threshold value as a target value for the occurrence rate of the second error based on a predetermined relationship between the occurrence rate of the second error and the power supply voltage or the frequency.

According to the information processing apparatus, controlling method for an information processing apparatus and program, when the occurrence rate of the first error is equal to or lower than the first threshold value, the control amount for controlling the power supply voltage or the frequency using the occurrence rate of the second error as a target value which is equal to or lower than the second threshold value is outputted.

The control amount outputting section may include a first error counting section adapted to count the number of first errors detected within an error detection unit period, a second error counting section adapted to count the number of second errors detected within the error detection unit period, and a control amount production section adapted to produce a control amount based on the predetermined relationship when the occurrence rate of the first error obtained from the number of first errors counted within the error detection unit period is equal to or lower than the first threshold value and the occurrence rate of the second error obtained from the number of the second errors counted within the error detection unit period is higher than the second threshold value. According to the information processing apparatus, when the occurrence rate of the first error obtained from the number of the first errors counted within the error detection unit period is equal to or lower than the first threshold value, the control amount for controlling the power supply voltage or the frequency using the occurrence rate of the second error as a target value equal to or lower than the second threshold value is outputted.

In this instance, the information processing apparatus may be configured such that the control amount production section includes a conversion table in which the control amount obtained from the predetermined relationship is associated with a logarithm of the number of the second errors detected within the error detection unit period, a logarithm arithmetic operation section adapted to arithmetically operate the logarithm of the number of the second errors counted within the error detection unit, and a voltage control amount acquisition section adapted to acquire, when the occurrence rate of the first error obtained from the number of the first errors counted within the error detection unit period is equal to or lower than the first threshold value and the occurrence rate of the second error obtained from the number of the second errors counted within the error detection unit period is higher than the second threshold value, the control amount corresponding to the logarithm arithmetically operated by the logarithm arithmetic operation section from the conversion table. According to the information processing apparatus, a control amount corresponding to the second error number is acquired from the conversion table.

In this instance, the logarithm arithmetic operation section may output a value obtained by subtracting 1 from a value at the most significant digit from among bits of 1 in a bit string in which the number of the second errors is represented by a binary notation. According to the information processing apparatus, the value obtained by subtracting 1 from the value at the most significant digit from among the bits of 1 in the bit string in which the number of the second errors is represented by a binary notation is outputted.

The control amount may be used for the power supply voltage, and the control amount outputting section may output the control amount for stepping up the power supply voltage by a predetermined voltage if the occurrence rate of the first error is higher than the first threshold value. According to the information processing apparatus, if the occurrence rate of the first error is higher than the first threshold value, then the power supply voltage is stepped up by the predetermined voltage.

The control amount may be used for the power supply voltage, and the control amount outputting section may output the control amount for stepping down the power supply voltage by a predetermined voltage if, within a longer period than a predetermined decision reference period, the occurrence rate of the first error is equal to or lower than the first threshold value and the occurrence rate of the second error is equal to or lower than the second threshold value. According to the information processing apparatus, if the occurrence rates of the first and second errors are equal to or lower than the respective threshold values within a longer period than the predetermined decision reference period, then the control amount for stepping down the power supply voltage by the predetermined voltage is outputted.

The control amount may be used for the power supply voltage, and the control amount production section may produce the control amount for each error detection unit period and produces the control amount within the present operation cycle based on the predetermined relationship if the control amount produced within the immediately preceding operation cycle is zero within each error detection unit period. According to the information processing apparatus, if the control amount produced within the immediately preceding operation cycle is zero, then the control amount within the present operation cycle is produced based on the predetermined relationship.

In this instance, when the occurrence rate of the second error is equal to or higher than a first upper limit value or when the control amount produced within the immediately preceding operation cycle is zero, the control amount production section may produce the control amount within the present operation cycle based on the predetermined relationship. According to the information processing apparatus, when the occurrence rate of the second error is equal to or higher than the first upper limit value or when the control amount produced within the immediately preceding operation cycle is zero, the control amount within the present operation cycle is produced based on the predetermined relationship.

In this instance, when the occurrence rate of the second error is equal to or higher than a second upper limit value which is higher than the first upper limit value, the control amount production section may produce the control amount for stepping up the power supply voltage by a predetermined voltage. According to the information processing apparatus, when the occurrence rate of the second error is equal to or higher than the second upper limit value, the control amount for stepping up the power supply voltage by the predetermined voltage is produced.

The control amount may be used for the frequency, and the information processing apparatus may further include a clock generation circuit adapted to generate the clock signal whose frequency is set in accordance with the control amount. According to the information processing apparatus, the clock signal whose frequency is set in accordance with the control amount is produced.

In this instance, the controlling output section may output the control amount for decreasing the frequency by a predetermined frequency if the occurrence rate of the first error is higher than the first threshold value. According to the information processing apparatus, if the occurrence rate of the first error is higher than the first threshold value, then the control amount for decreasing the frequency by the predetermined frequency is outputted.

Or, the control amount outputting section may output the control amount for stepping up the frequency by a predetermined frequency if, within a longer period than a predetermined decision reference period, the occurrence rate of the first error is equal to or lower than the first threshold value and the occurrence rate of the second error is equal to or lower than the second threshold value. According to the information processing apparatus, if, within a longer period than the predetermined decision reference period, the occurrence rates of the first and second errors are equal to or lower than the respective threshold values, then the control amount for stepping up the frequency by the predetermined frequency is outputted.

According to another embodiment of the disclosed technology, there is provided an information processing system including an information processing apparatus and a power supply apparatus. The information processing apparatus includes: a first retention section adapted to retain and output data in accordance with a clock signal; a processing section adapted to process the outputted data and output the data as processed data; a first error detection code production section adapted to produce a first error detection code for detecting an error of the processed data from the processed data; a second error detection code production section adapted to produce a second error detection code for detecting an error of the processed data from the first error detection code; a second retention section adapted to retain the processed data and the first and second error detection codes in accordance with the clock signal; and a first error detection section adapted to detect an error of the retained processed data as a first error using the retained first error detection code. The information processing apparatus further includes: a second error detection section adapted to detect an error of the retained processed data as a second error using the retained second error detection code; and a control amount outputting section adapted to control, when an occurrence rate of the first error by the first error detection section is equal to or lower than a first threshold value while an occurrence rate of the second error by the second error detection section is higher than a second threshold value, a control amount for controlling a power supply voltage to the processing section or a frequency of the clock signal taking the second threshold value as a target value for the occurrence rate of the second error based on a predetermined relationship between the occurrence rate of the second error and the power supply voltage or the frequency. The power supply apparatus supplies the power supply voltage to the information processing apparatus and controls the power supply voltage based on the outputted control amount. In the information processing system, when the occurrence rate of the first error is equal to or lower than the first threshold value, the control amount for controlling the power supply voltage or the frequency using the occurrence rate of the second error as a target value which is equal to or lower than the second threshold value is outputted.

In summary, with the disclosed technology, a superior advantage that it facilitates setting of an accurate value of a power supply voltage or an operating frequency with which a malfunction does not occur to an information processing apparatus.

The above and other features and advantages of the present technology will become apparent from the following description and the appended claims, taken in conjunction with the accompanying drawings in which like parts or elements denoted by like reference symbols.

BRIEF DESCRIPTION OF THE DRAWINGS

FIG. 5 is a truth table illustrating an example of a result of operation of a time slice controlling section of the information processing apparatus;

FIG. 6 is a table illustrating an example of a result of arithmetic operation of a logarithm arithmetic operation section of the information processing apparatus;

FIG. 8 is a graph illustrating an example of a relationship between a logarithm of a second error occurrence rate and a power supply voltage in the information processing apparatus;

FIG. 10 is a view illustrating an example of a voltage control amount conversion table in the information processing apparatus;

FIG. 21 is a table illustrating causes of a malfunction of the information processing apparatus;

FIG. 22 is a table illustrating comparison between the information processing apparatus and an apparatus which uses a technology in the past;

DETAILED DESCRIPTION OF THE PREFERRED EMBODIMENTS

In the following, preferred embodiments of the technology disclosed herein are described in detail with reference to the accompanying drawings. The description is given in the following order.

1. First Embodiment (control of the power supply voltage: example wherein the logarithm of the second error number is arithmetically operated)
2. Second Embodiment (control of the power supply voltage: example wherein increase of the second error number is prevented)
3. Third Embodiment (control of the power supply voltage: example wherein occurrence of a first error number is prevented)
4. Fourth Embodiment (control of the frequency)

1. First Embodiment

Configuration Example of the Information Processing System

Figure 1:
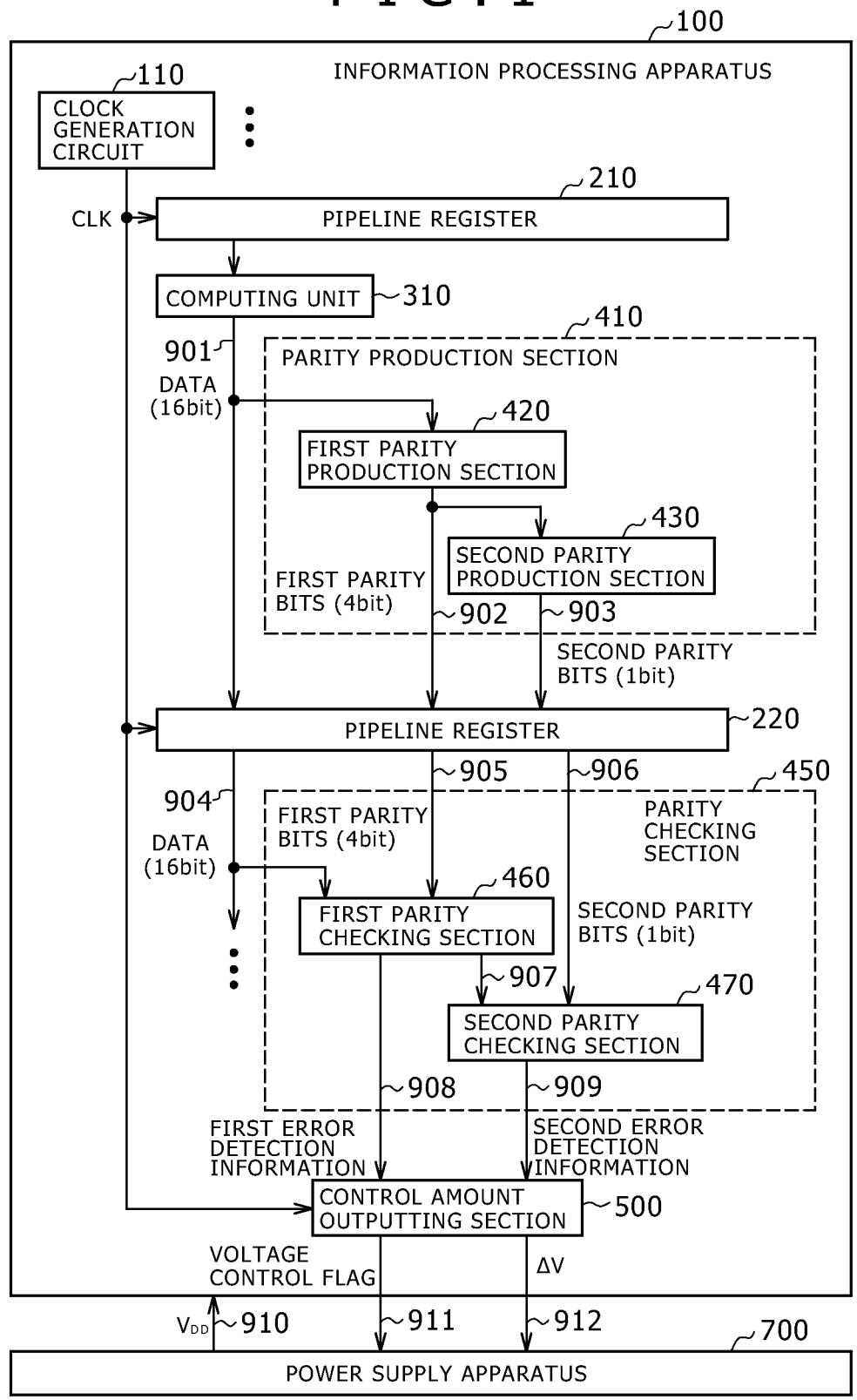
FIG. 1 is a block diagram showing an example of a configuration of an information processing system according to a first embodiment of the technology disclosed herein.

FIG. 1 shows an example of a configuration of an information processing system according to a first embodiment of the disclosed technology. Referring to FIG. 1, the information processing system shown includes an information processing apparatus 100 and a power supply apparatus 700. The information processing apparatus 100 includes a clock generation circuit 110, pipeline registers 210 and 220, a computing unit 310, a parity production section 410, a parity checking section 450, and a control amount outputting section 500.

The clock generation circuit 110 produces a clock signal CLK of a predetermined frequency. The clock generation circuit 110 supplies the produced clock signal CLK to the pipeline registers 210 and 220 and the control amount outputting section 500.

The pipeline register 210 retains a result of processing at a predetermined stage in a pipeline process in accordance with the clock signal CLK and outputs the processing result. The processing result retained by the pipeline register 210 includes data of, for example, 16 bits. The pipeline register 210 retains the processing result at a predetermined stage and outputs the processing result in accordance with the clock signal CLK.

The computing unit 310 executes predetermined arithmetic operation for data outputted from the pipeline register 210. The computing unit 310 outputs a result of the arithmetic operation to the parity production section 410 and the pipeline register 220 through a signal line 901. This processing result includes data of 16 bits.

The parity production section 410 includes a first parity production section 420 and a second parity production section 430.

The first parity production section 420 produces parity bits from data outputted from the computing unit 310. For example, the first parity production section 420 executes XOR (exclusive ORing) arithmetic operation for each of 4 bit strings of 4 bits which configure data of 16 bits to produce 4 parity bits. In the following description, such parity bits produced from data are referred to as first parity bits. The first parity production section 420 outputs the produced first parity bits to the second parity production section 430 and the pipeline register 220 through a signal line 902.

The second parity production section 430 produces a parity bit from the first parity bits outputted from the first parity production section 420. For example, the second parity production section 430 executes XOR arithmetic operation for the 4 first parity bits to produce one parity bit. In the following description, a parity bit produced from the first parity bits is referred to as second parity bit. The second parity production section 430 outputs the produced second parity bit to the pipeline register 220 through a signal line 903.

The pipeline register 220 retains a result of processing at a predetermined stage in a pipeline process and outputs the processing result in accordance with the clock signal CLK. In particular, the pipeline register 220 retains data outputted from the computing unit 310 and first parity bits and a second parity bit outputted from the parity production section 410 and outputs the retained data and first and second parity bits to a succeeding stage in accordance with the clock signal CLK. Here, the data of an arithmetic operation result retained in the pipeline register 220 is outputted to a first parity checking section and a stage at the succeeding stage through a signal line 904. Further, the first parity bits and the second parity bit retained in the pipeline register 220 are outputted to the parity checking section 450 through signal lines 905 and 906, respectively.

The parity checking section 450 includes a first parity checking section 460 and a second parity checking section 470.

The first parity checking section 460 uses the first parity bits retained in the pipeline register 220 to detect an error of the data of the arithmetic operation result retained in the pipeline register 220. For example, the first parity checking section 460 executes XOR arithmetic operation for 4 bit strings of 4 bits which configure the data of 16 bits to produce 4 parity bits. Then, the first parity checking section 460 outputs the produced 4 parity bits to the second parity checking section 470 through a signal line 907. The first parity checking section 460 compares the produced parity bits and the first parity bits retained in the pipeline register 220 with each other and produces information of 1 bit indicative of a result of OR arithmetic operation of results of the comparison as first error detection information. If some of the comparison results indicate incoincidence, then an error is detected. In the following description, an error detected from the first parity bits is referred to as first error. The first parity checking section 460 outputs the first error detection information to the control amount outputting section 500 through a signal line 908.

The second parity checking section 470 detects an error of data of an arithmetic operation result retained in the pipeline register 220 using the second parity bit retained in the pipeline register 220. In particular, the second parity checking section 470 executes XOR arithmetic operation for 4 parity bits outputted from the first parity checking section 460 to produce one parity bit. The second parity checking section 470 compares the produced parity bit and the second parity bit with each other to produce information of 1 bit representative of a result of the comparison as second error detection information. If the comparison result indicates incoincidence, then an error is detected. In the following, an error detected from the second parity bit is referred to as second error. The second parity checking section 470 outputs the second error detection information to the control amount outputting section 500 through a signal line 909.

The control amount outputting section 500 outputs a voltage control amount $\Delta V$ for controlling a power supply voltage $V_{DD}$ to be supplied to the information processing apparatus 100 based on first error detection information and second error detection information. In particular, the control amount outputting section 500 acquires a rate of occurrence of a first error and a second error from first error detection information and second error detection information. If the rate of occurrence of the first error is higher than a first threshold value therefor, then the control amount outputting section 500 executes a process for preventing a system error such as to urgently step up the power supply voltage $V_{DD}$. Here, the first threshold value is an allowance for the rate of occurrence of a first error. As the first threshold value, a real number equal to or higher than 0 such as, for example, 0, is set.

If the rate of occurrence of the first error is equal to or lower than the first threshold value, then the control amount outputting section 500 arithmetically operates a voltage control amount $\Delta V$ for controlling the power supply voltage $V_{DD}$ setting a second threshold value as a target value for the rate of occurrence of the second error. Here, the second threshold value is an allowance for the rate of occurrence of a second error. As the second threshold value, a real number equal to or higher than 0 such as, for example, 1/129, is set. If the rate of occurrence of the second error is higher than the second threshold value, then a voltage control amount $\Delta V$ other than 0 is arithmetically operated. If the occurrence rate of second errors is equal to or lower than the second threshold value, then the voltage control amount $\Delta V$ is 0. Details of an arithmetic operation method for the voltage control amount $\Delta V$ are hereinafter described. The control amount outputting section 500 outputs the arithmetically operated voltage control amount $\Delta V$ to the power supply apparatus 700 through a signal line 912. After the voltage control amount $\Delta V$ is outputted, the control amount outputting section 500 outputs a voltage control flag to the power supply apparatus 700 through a signal line 911 at a predetermined timing. The voltage control flag is a signal for instructing the power supply apparatus 700 to add the outputted voltage control amount ΔV to the power supply voltage $V_{DD}$.

The power supply apparatus 700 supplies power to the information processing apparatus 100. The power supply apparatus 700 supplies power to the information processing apparatus 100 through a cable 910. Further, if a voltage control flag is received, then the power supply apparatus 700 updates the power supply voltage to a value obtained by addition of the voltage control amount ΔV to the power supply voltage $V_{DD}$.

It is to be noted that the pipeline registers 210 and 220 are an example of the first and second retaining sections. The first parity production section 420 is an example of the first error detection signal production section. The second parity production section 430 is an example of the second error detection signal production section. The first parity checking section 460 is an example of the first error detection section. The second parity checking section 470 is an example of the second error detection section.

Figure 2:
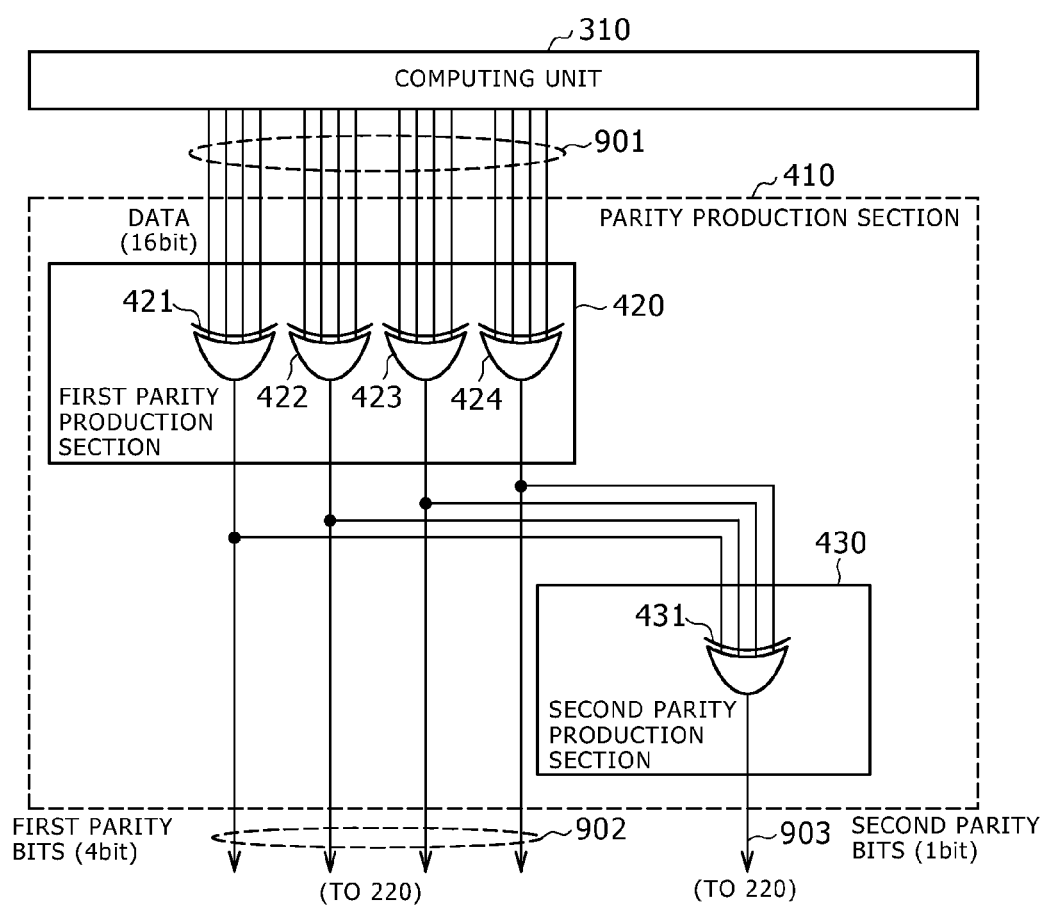
FIG. 2 is a circuit diagram showing an example of a configuration of a first parity production section and a second parity production section of an information processing apparatus in the information processing system.

FIG. 2 shows an example of a configuration of the first parity production section 420 and the second parity production section 430 in the first embodiment. The first parity production section 420 includes XOR gates 421 to 424. The second parity production section 430 includes an XOR gate 431.

Each of the XOR gates 421 to 424 and 431 outputs an XOR value of input values thereto. Data of 16 bits outputted from the computing unit 310 are divided into 4 groups each including a bit string of 4 bits. To the XOR gates 421 to 424, bit strings belonging to different groups from one another are inputted. The XOR gates 421 to 424 output XOR values of the bit strings inputted thereto as first parity bits to the XOR gate 431 and the pipeline register 220. The XOR gate 431 outputs an XOR value of the four first parity bits from the XOR gates 421 to 424 as a second parity bit to the pipeline register 220.

Figure 3:
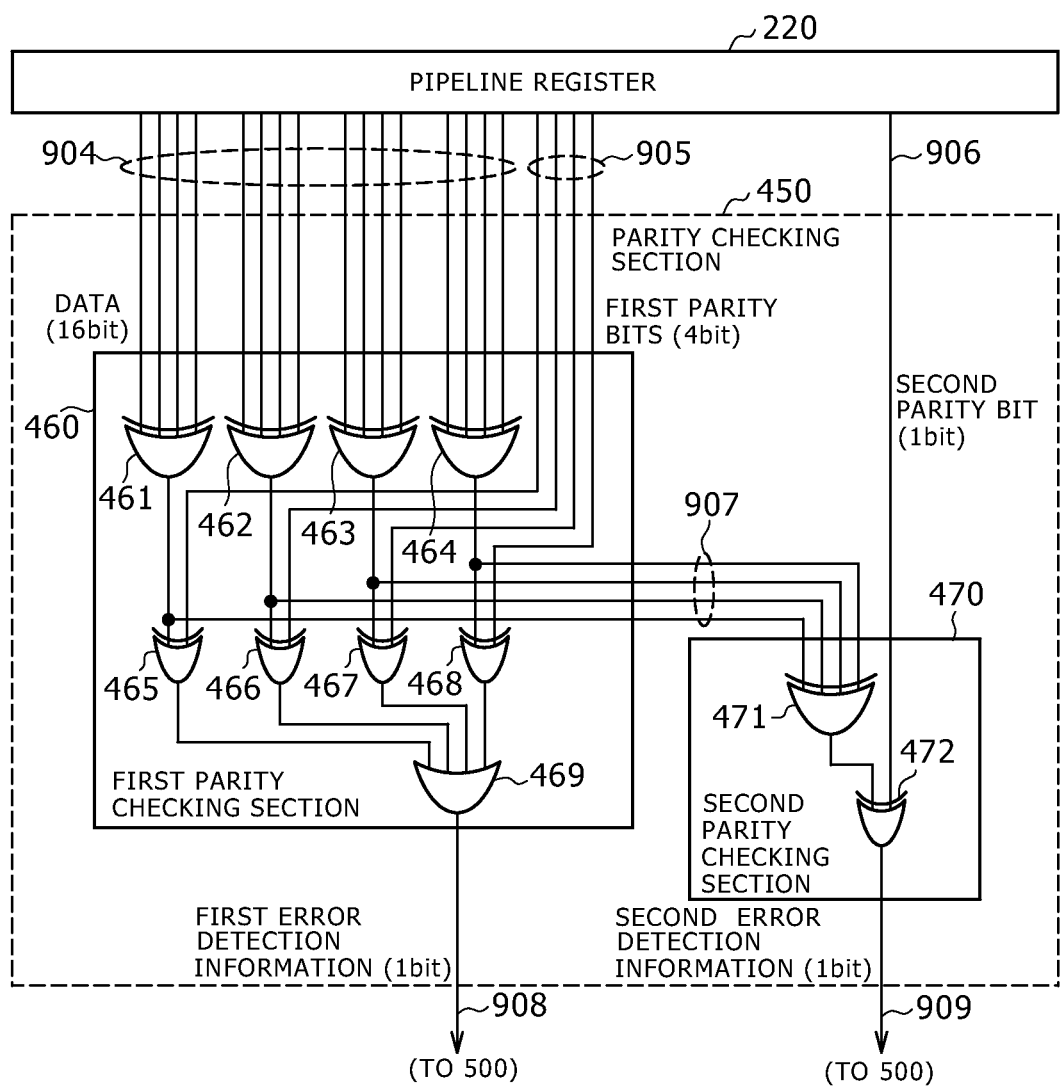
FIG. 3 is a circuit diagram showing an example of a configuration of a first parity checking section and a second parity checking section of the information processing apparatus.

FIG. 3 shows an example of a configuration of the first parity checking section 460 and the second parity checking section 470 in the first embodiment. The first parity checking section 460 includes XOR gates 461 to 468 and an OR gate 469. The second parity checking section 470 includes XOR gates 471 and 472.

Each of the XOR gates 461 to 468 and the XOR gates 471 and 472 outputs an XOR value of input values thereto. To the XOR gates 461 to 464, bit strings which belong to different groups from one another are inputted. The XOR gates 461 to 464 output XOR values of input values to the XOR gates 465 to 468, respectively. Each of the XOR values is an even parity bit which has the value of 0 where the four bits belonging to the corresponding group includes an even number of bits of 1. Further, the XOR gates 461 to 464 output the parity bits also to the XOR gate 471. To each of the XOR gates 465 to 468, a parity bit from a corresponding one of the XOR gates 461 to 464 and a corresponding first parity bit are inputted. The XOR gates 465 to 468 output XOR values of the input values thereto to the OR gate 469. Each of the XOR values is error detection information of 1 bit which exhibits the value 1 in the case where a parity bit error, that is, a first error, is detected in the bit string belonging to the corresponding group but exhibits the value 0 in the case where no parity bit error is detected. The XOR gate 471 outputs an XOR value of input values thereto from the XOR gates 465 to 468 to the XOR gate 472. This XOR value is an even parity bit which exhibits the value 0 in the case where the data of 16 bits includes an even number of bits which have the value 1. To the XOR gate 472, the parity bit from the XOR gate 471 and the second parity bit are inputted. The XOR gate 472 outputs an XOR value of the input values thereto as second error detection information to the control amount outputting section 500.

The OR gate 469 outputs an XOR value of input values thereto. The OR gate 469 outputs an XOR value of error detection information from the XOR gates 465 to 468 as first error detection information to the control amount outputting section 500.

Figure 4:
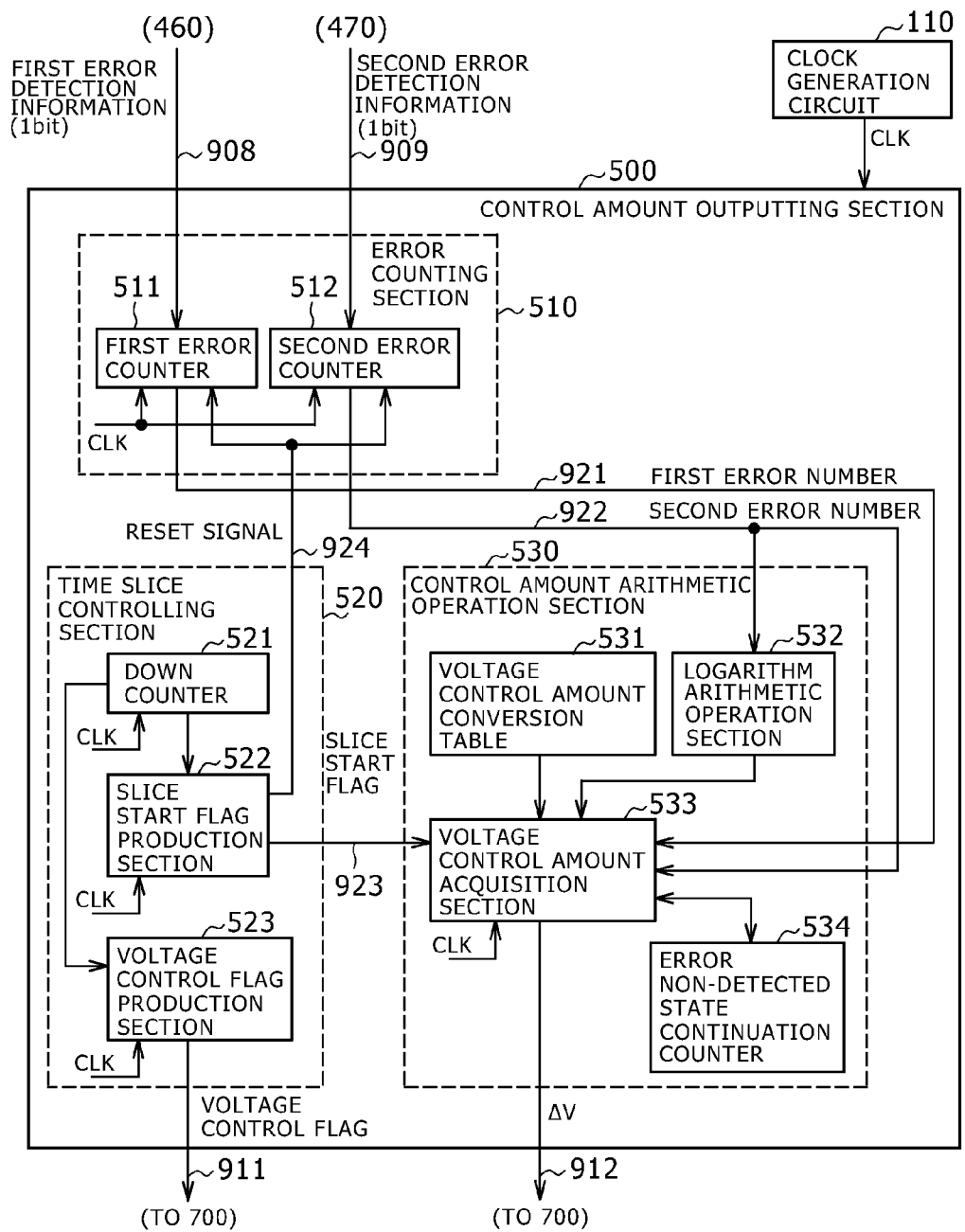
FIG. 4 is a block diagram showing an example of a configuration of a control amount outputting section of the information processing apparatus.

FIG. 4 shows an example of a configuration of the control amount outputting section 500 in the first embodiment. Referring to FIG. 4, the control amount outputting section 500 includes an error counting section 510, a time slice controlling section 520 and a control amount arithmetic operation section 530. The error counting section 510 includes a first error counter 511 and a second error counter 512. The time slice controlling section 520 includes a down counter 521, a slice start flag production section 522 and a voltage control flag production section 523. The control amount arithmetic operation section 530 includes a voltage control amount conversion table 531, a logarithm arithmetic operation section 532, a voltage control amount acquisition section 533 and a error non-detected state continuation counter 534.

The first error counter 511 counts the number of first errors detected within a predetermined unit period for error detection based on first error detection information. The unit period is hereinafter referred to as "time slice." The length of the time slice is set to a period longer than the clock cycle. For example, as the length of the time slice, 129 clock cycles are set. The first error counter 511 increments its counter value by one if the first error detection information indicates that a first error is detected within each clock cycle. The first error counter 511 outputs the counter value as a first error number to the voltage control amount acquisition section 533 through a signal line 921. Then, the counter value of the first error counter 511 is initialized to zero by the slice start flag production section 522 at a predetermined timing within a time slice.

The second error counter 512 counts the number of second errors detected in a time slice based on second error detection information. In particular, if the second error detection information indicates that a second error is detected within each clock cycle indicated by the clock signal CLK, then the second error counter 512 increments the counter value by one. The second error counter 512 outputs the counter value as a second error number to the logarithm arithmetic operation section 532 and the voltage control amount acquisition section 533 through a signal line 922. Then, the counter value of the second error counter 512 is initialized to zero by the slice start flag production section 522 at a predetermined timing within the time slice.

The down counter 521 counts the elapsed time within a time slice. In particular, every time a clock cycle elapses, the down counter 521 decrements the counter value by one. Within a next cycle after the counter value becomes equal to 0, the down counter 521 resets the counter value to an initial value such as, for example, 128.

The slice start flag production section 522 produces a slice start flag and a reset signal based on a counter value of the down counter 521. The slice start flag is a signal for instructing the control amount arithmetic operation section 530 to start arithmetic operation of the voltage control amount ΔV at a predetermined timing within a time slice. The reset signal is a signal for instructing the first error counter 511 and the second error counter 512 to carry out initialization. The slice start flag production section 522 produces a slice start flag when the value of the down counter 521 is, for example, 126, and outputs the slice start flag to the control amount arithmetic operation section 530 through a signal line 923. After the slice start flag is outputted, when a predetermined number of clock cycles, for example, four clock cycles, pass, the slice start flag production section 522 outputs a reset signal through a signal line 924. Here, the reset signal is outputted at a timing after sufficient time to end the arithmetic operation of the voltage control amount $\Delta V$ elapses after the slice start flag is outputted.

The voltage control flag production section 523 produces a voltage control flag based on the counter value of the down counter 521. In particular, the voltage control flag production section 523 produces a voltage control flag within a predetermined period, within which the counter value of the down counter 521 ranges from 119 to 64, and outputs the voltage control flag to the power supply apparatus 700. The voltage control flag is outputted at a timing after sufficient time to end arithmetic operation of the voltage control amount $\Delta V$ elapses after the slice start flag is outputted. Further, for an output period of the voltage control flag, time sufficient for the power supply apparatus 700 to receive the voltage control flag is set. In the case where the power supply apparatus 700 is positioned remotely and time is required for transmission of signal transition of the voltage control flag, comparatively long time is set as the output period of the voltage control flag.

The voltage control amount conversion table 531 stores logarithms of the second error number and values of the voltage control amount $\Delta V$ in an associated relationship with each other. The second error number in most cases increases like an exponential function as the power supply voltage $V_{DD}$ drops. In the case where the second error number and the power supply voltage $V_{DD}$ have an exponential relationship therebetween, the exponential relationship can be approximated to a proportional relationship between the logarithm of the second error number and the power supply voltage $V_{DD}$. Further, the power supply voltage when the error occurrence rate becomes equal to the second threshold value such as, for example, 1/129 is defined as a lowest operating voltage $V_{min}$ in advance. In the voltage control amount conversion table 531, the voltage control amount $\Delta V$ for controlling, for each logarithm of the second error number, the power supply voltage $V_{DD}$ corresponding to the logarithm to the lowest operating voltage $V_{min}$ based on the proportional relationship described above is stored.

The logarithm arithmetic operation section 532 arithmetically operates a logarithm of the second error number, and the value of the base of the logarithm is set, for example, to 2. The logarithm arithmetic operation section 532 outputs a result of the arithmetic operation to the voltage control amount acquisition section 533.

The voltage control amount acquisition section 533 acquires the voltage control amount $\Delta V$ based on the first error number and the second error number. More particularly, the voltage control amount acquisition section 533 executes a process for preventing a system error such as to urgently step up the power supply voltage $V_{DD}$ if the occurrence rate of the first error is equal to or higher than the first threshold value. If the occurrence rate of the first error is lower than the first threshold value, then the voltage control amount acquisition section 533 decides whether or not a state in which the occurrence rate of the first error is equal to the first threshold value and the occurrence rate of the second error is lower than the second threshold value continues for a fixed period of time. More particularly, the voltage control amount acquisition section 533 controls the error non-detected state continuation counter 534 to count the number of time slices within which the state in which the occurrence rates of the first and second errors are lower than the respective threshold values continue for the fixed time. The state just described is hereinafter referred to as "error non-detected state." The voltage control amount acquisition section 533 refers to the counter value to decide whether or not the error non-detected state has continued for the fixed time.

If the error non-detected state has not continued for the fixed period, then the voltage control amount acquisition section 533 acquires a voltage control amount $\Delta V$ corresponding to the logarithm of the second error number from the voltage control amount conversion table 531 and outputs the acquired voltage control amount $\Delta V$ to the power supply apparatus 700. However, if a voltage control amount $\Delta V$ of a value other than zero was outputted within the immediately preceding time slice, then the voltage control amount acquisition section 533 sets the voltage control amount $\Delta V$ to be outputted within the current time slice to zero irrespective of the value of the logarithm of the second error number. This is carried out in order to calculate the voltage control amount $\Delta V$ accurately. Generally, the power supply voltage $V_{DD}$ does not vary immediately even if a voltage control amount $\Delta V$ is outputted, but some time interval is required until the power supply voltage $V_{DD}$ is updated to a value obtained by adding the current value to the voltage control amount $\Delta V$. The number of second errors detected during updating of the power supply voltage $V_{DD}$ cannot be regarded fully as the number of second errors detected with the power supply voltage $V_{DD}$ after updated. Therefore, if the control amount arithmetic operation section 530 arithmetically operates a voltage control amount $\Delta V$ based on the number of second errors detected with the power supply voltage $V_{DD}$ after updated, then an inaccurate value of the voltage control amount $\Delta V$ is outputted. Accordingly, if the voltage control amount $\Delta V$ other than 0 was outputted within the immediately preceding time slice, then the voltage control amount $\Delta V$ is set to zero within the current time slice within which the power supply voltage $V_{DD}$ is being updated.

On the other hand, if the error non-detected state has continued for the fixed period, then the voltage control amount acquisition section 533 outputs a predetermined step-down set value for stepping down the power supply voltage $V_{DD}$ as a value of the voltage control amount $\Delta V$.

The error non-detected state continuation counter 534 counts the number of time slices within which the error non-detected state has continued under the control of the voltage control amount acquisition section 533.

It is to be noted that a time slice is an example of the error detection unit period. The first error counter 511 is an example of the first error counting section. The second error counter 512 is an example of the second error counting section.

FIG. 5 is a truth table illustrating an example of a result of operation of the time slice controlling section 520 in the first embodiment. In the case where the counter value of the down counter 521 is 128 or 127, the time slice controlling section 520 sets the value of the slide start flag and the voltage control flag to zero. This period is included in a standby cycle within a time slice. Then, when the counter value of the down counter 521 becomes 126, the time slice controlling section 520 sets the slice start flag to 1 and outputs the slide start flag.

In the case where the counter value of the down counter 521 is one of 125 to 120, the time slice controlling section 520 sets the values of the slice start flag and the voltage control flag to 0. This period is classified to a voltage control amount calculation cycle. As the length of the voltage control amount calculation cycle, sufficient time before arithmetic operation of the voltage control amount $\Delta V$ is completed is set. If the length of the voltage control amount calculation cycle is set to plural clock cycles, then it is permitted for arithmetic operation of the voltage control amount ΔV to be carried out over a plurality of clock cycles. However, even in this instance, a circuit may naturally be incorporated in the control amount arithmetic operation section 530 so that the calculation is completed immediately in one clock cycle. In the case where the counter value of the down counter 521 is one of 119 to 64, the time slice controlling section 520 sets the value of the voltage control flag to 1 and outputs the voltage control flag. This period is classified to a voltage control amount supplying cycle. As the length of the voltage control amount supplying cycle, sufficient time for the power supply apparatus 700 to receive the voltage control flag is set. While the counter value of the down counter 521 is one of 63 to 0, the time slice controlling section 520 sets the values of the slice start flag and the voltage control flag to zero. This period is included in a standby cycle within the time slice.

FIG. 6 shows a table illustrating an example of a result of arithmetic operation of the logarithm arithmetic operation section 532 in the first embodiment. The logarithm arithmetic operation section 532 is implemented by a priority encoder or the like which outputs a value obtained by subtracting 1 from the digit of the bit of the most significant digit from among those bits of 1 in a bit string indicative of a second error number. This output value is a value obtained by truncating a portion after the decimal point from a logarithm of a second error number E2 where the base is 2. For example, in the case where the bit string representative of the second error number is "00000011," "00000010" obtained by rewriting the bit of the first digit lower than the second digit into 0. Then, a bit string "001" indicative of value ("1") obtained by subtracting 1 from the digit ("2") of the bit of 1 from within the bit string is outputted. On the other hand, in the case where the second error number is "00000111," "00000100" obtained by rewriting all of those bits at and lower than the second digit into 0 is arithmetically operated. Then, a bit string "010" indicative of a value ("2") obtained by subtracting 1 from the digit ("3") of the bit of 1 from within the bit string is outputted.

Figure 7:
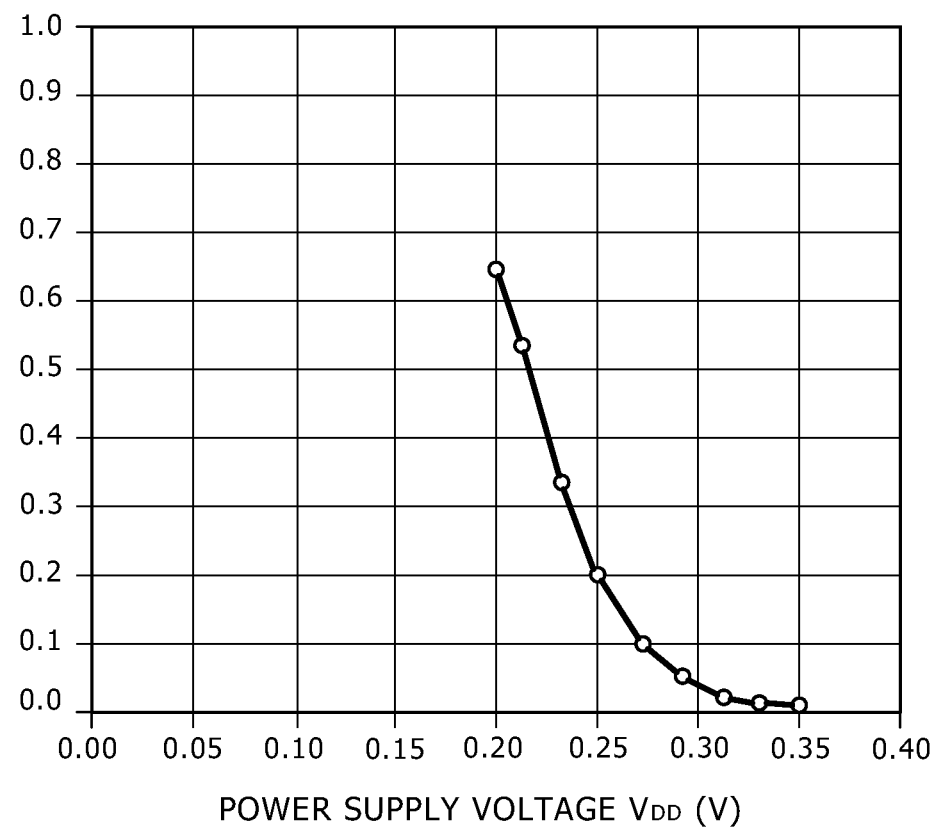
FIG. 7 is a graph illustrating an example of a relationship between a second error occurrence rate and a power supply voltage in the information processing apparatus.

FIG. 7 illustrates an example of a relationship between the second error occurrence rate R2 and the power supply voltage $V_{DD}$ in the first embodiment. Referring to FIG. 7, the axis of ordinate indicates the second error occurrence rate R2, and the axis of abscissa indicates the power supply voltage $V_{DD}$. In the example illustrated in FIG. 7, the second error occurrence rate R2 increases like an exponential function as the power supply voltage $V_{DD}$ drops.

FIG. 8 illustrates an example of a relationship between the logarithm of the second error occurrence rate R2 and the power supply voltage $V_{DD}$ in the first embodiment. Referring to FIG. 8, the axis of ordinate indicates the logarithm of the second error occurrence rate R2, that is, $\log_2 R2$, and the axis of abscissa indicates the power supply voltage $V_{DD}$. The exponential relationship between the power supply voltage $V_{DD}$ and the second error occurrence rate R2 in FIG. 7 can be approximated to a proportional relationship between the logarithm of the second error occurrence rate R2 and the power supply voltage $V_{DD}$ as seen in FIG. 8. From this proportional relationship, the voltage control amount ΔV for controlling, when a certain second error occurrence rate R2 is detected, the power supply voltage $V_{DD}$ corresponding to the second error occurrence rate R2 to the lowest operating voltage $V_{min}$ is calculated.

Figure 9:
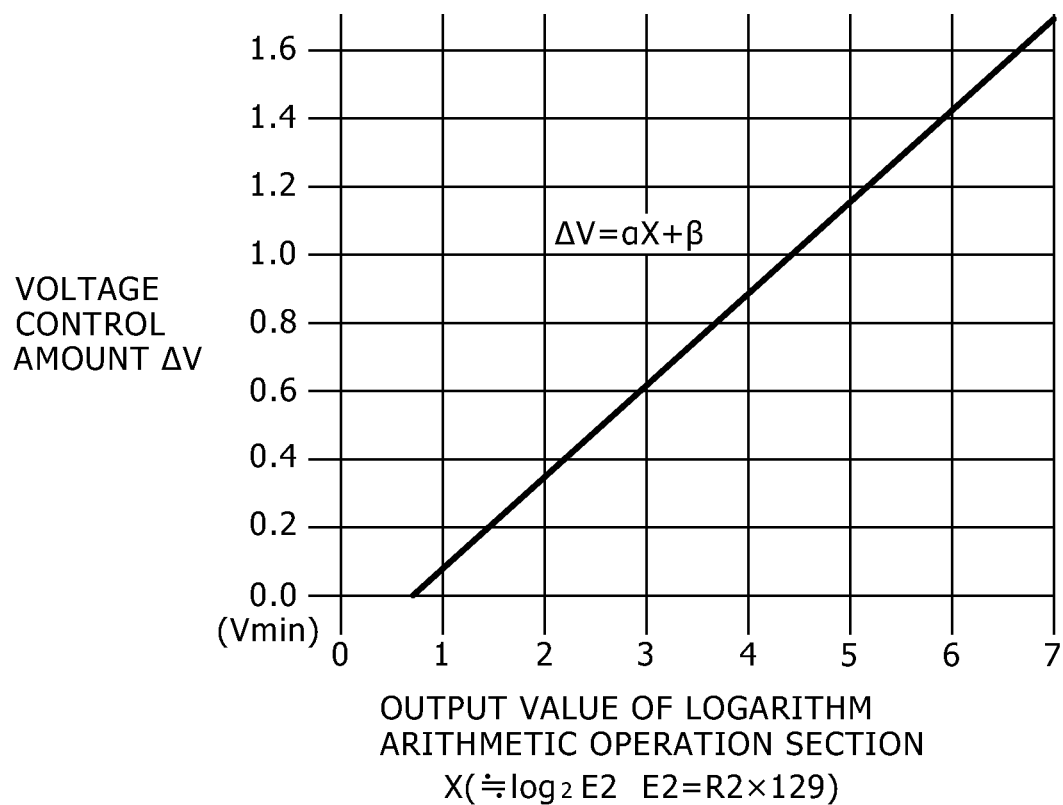
FIG. 9 is a graph illustrating an example of a relationship between an output value of the logarithm arithmetic operation section and a voltage control amount in the information processing apparatus.

FIG. 9 illustrates an example of a relationship between the output value of the logarithm arithmetic operation section 532 and the voltage control amount ΔV in the first embodiment. Referring to FIG. 9, the axis of ordinate indicates the voltage control amount ΔV, and the axis of abscissa indicates the output value of the logarithm arithmetic operation section 532. The logarithm arithmetic operation section 532 arithmetically operates and outputs an approximated value (≈$\log_2 E2$) to the logarithm of the second error number E2 calculated within a time slice, which is 129 cycles. The second error number E2 within 129 cycles is a value obtained by multiplying the second error occurrence rate R2 by 129, and therefore, $\log_2 E2$ is equal to the sum of $\log_2 R2$ of the axis of ordinate and $\log_2 129$. Since the logarithm of the second error occurrence rate R2 and the power supply voltage $V_{DD}$ have a proportional relationship to each other as illustrated in FIG. 8, the voltage control amount ΔV varies in proportion to the output value as seen in FIG. 9. In the voltage control amount conversion table 531, a voltage control amount ΔV corresponding to each output value of the logarithm arithmetic operation section 532 is set based on the proportional relationship illustrated in FIG. 9.

FIG. 10 illustrates an example of information stored in the voltage control amount conversion table 531. Referring to FIG. 10, in the voltage control amount conversion table 531, a voltage control amount ΔV is set in an associated relationship with each output value of the logarithm arithmetic operation section 532. With each output value, a step-down set value such as, for example, −1 for stepping down the power supply voltage by a predetermined voltage and a value set based on the proportional relationship between the logarithm of second error number and the power supply voltage are associated as a voltage control amount ΔV. Here, the step-down voltage is read out from the voltage control amount conversion table 531 when the output value of the logarithm arithmetic operation section 532 is 0 and the error non-detected state continuation flag is 1.

The error non-detected state continuation flag is a flag which is set to 1 when the error non-detected state continues for more than a predetermined number (CFG_COUNT) of time slices but is set to 0 in any other case. In other words, if the error non-detected state continues for more than the time of the time slice number CFG_COUNT, the step-down set value is outputted as a value of the voltage control amount ΔV.

It is to be noted that the period of time slices indicated by time slice number CFG_COUNT is an example of the criterion period.

In FIG. 10, the output value is represented by a binary number, and the voltage control amount ΔV is represented by a binary number with a sign. Based on the proportional relationship between the logarithm of the error occurrence rate and the voltage control amount, for example, a voltage control amount ΔV of "0001" is set in an associated relationship with the output value "001." Further, voltage control amounts ΔV "0010," "0011" and "0100" are set in an associated relationship with output values "010," "011" and "100," respectively. In this manner, a value which increases in proportion to the output value of the logarithm arithmetic operation section 532, that is, in proportion to the logarithm of a second error number, is set to the voltage control amount ΔV. It is to be noted that the values of the voltage control amount ΔV illustrated in FIG. 10 are set based on a proportional relationship obtained from a circuit different from the circuit from which the proportional relationship illustrated in FIG. 9 was observed.

Figure 11:
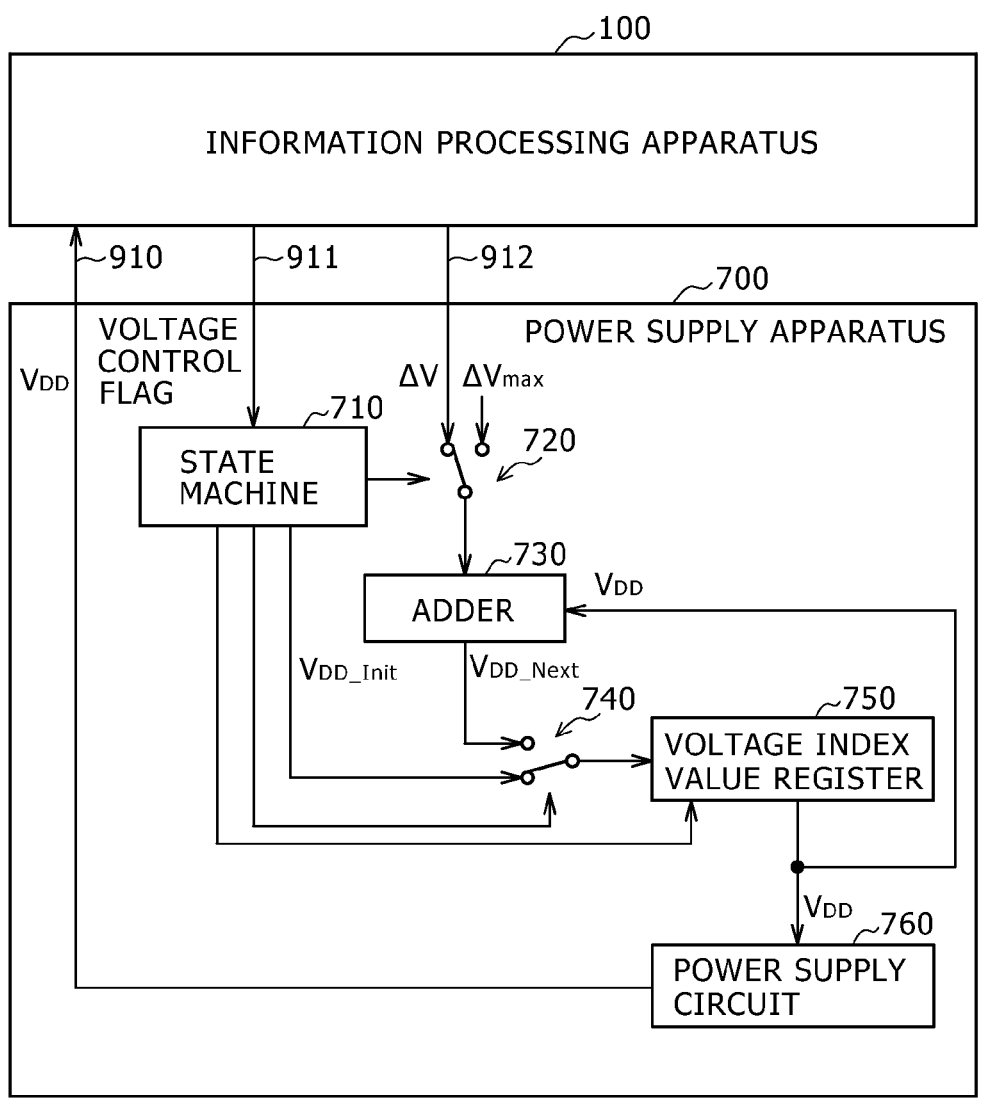
FIG. 11 is a block diagram showing an example of a configuration of a power supply apparatus in the information processing system.

FIG. 11 shows an example of a configuration of the power supply apparatus 700 in the first embodiment. Referring to FIG. 11, the power supply apparatus 700 includes a state machine 710, switches 720 and 740, an adder 730, a voltage index value register 750, and a power supply circuit 760.

The switch 720 switchably outputs a voltage control amount ΔV from the information processing apparatus 100 and a maximum voltage control amount $\Delta V_{max}$ to the adder 730 under the control of the state machine 710.

The adder 730 adds an output value of the switch 720 to the power supply voltage $V_{DD}$ outputted from the voltage index value register 750. The adder 730 outputs a result of the addition, that is, a value $V_{DD\_Next}$, to an input terminal of the switch 740.

The switch 740 switchably outputs the addition result $V_{DD\_Next}$ from the adder 730 and an initial value $V_{DD\_Init}$ for the power supply voltage outputted from the state machine 710 to the voltage index value register 750 under the control of the state machine 710.

The voltage index value register 750 retains and outputs an output value of the switch 740 to the adder 730 and the power supply circuit 760 under the control of the state machine 710.

The power supply circuit 760 controls the power supply voltage $V_{DD}$ based on an output value of the voltage index value register 750. The power supply circuit 760 carries out control of adjusting the current value of the power supply voltage $V_{DD}$ being supplied therefrom to the output value of the voltage index value register 750. The power supply circuit 760 supplies the power supply voltage $V_{DD}$ to the information processing apparatus 100.

The state machine 710 controls the switches 720 and 740, adder 730 and voltage index value register 750. More particularly, if power supply is made available to the power supply apparatus 700, then the state machine 710 outputs the initial value $V_{DD\_Init}$ for the power supply voltage to the switch 740. Then, the state machine 710 controls the switch 740 and the voltage index value register 750 to retain the initial value $V_{DD\_Init}$ into the voltage index value register 750. After the initial value $V_{DD\_Init}$ is retained, the state machine 710 starts acceptance of a voltage control flag from the information processing apparatus 100.

If the number of clock cycles in which a voltage control flag is received successively is equal to or higher than an updating set value such as, for example, 2, then the state machine 710 updates the value of the voltage index value register 750 with a value obtained by adding the voltage control amount $\Delta V$ to the power supply voltage $V_{DD}$. More particularly, the state machine 710 controls the switch 720 to input the voltage control amount $\Delta V$ to the adder 730 and controls the switch 740 and the voltage index value register 750 to update the value of the voltage index value register 750 with the addition result $V_{DD\_Next}$ of the adder 730.

Further, the state machine 710 does not accept the voltage control flag of 1 within a period until a clock cycle elapses by m times (m is an integer equal to or greater than 1) after a falling edge of the voltage control flag. The period mentioned is hereinafter referred to as "stabilization period."

On the other hand, if the state machine 710 does not successively receive a voltage control flag by n times (n is an integer greater than m), then it decides that a serious system error has occurred with the information processing apparatus 100. In this instance, the state machine 710 controls the switches 720 and 740 and the voltage index value register 750 to update the value of the voltage index value register 750 with a value obtained by adding the maximum voltage control amount $\Delta V_{max}$ to the power supply voltage $V_{DD}$.

The state machine 710 may weigh the voltage control amount $\Delta V$ and add the weighted voltage control amount $\Delta V$ to the power supply voltage $V_{DD}$. For example, in the case where the state machine 710 may carry out weighting by two times and the voltage control amount $\Delta V$ is −1 while the value of the power supply voltage $V_{DD}$ before the updating is 125, the power supply voltage $V_{DD}$ is updated to 123. The reason why the weighting is permitted is that, although the value of the voltage index value register 750 is a factor for determining a power supply voltage to be outputted actually, the value and the actual power supply voltage may not necessarily have a proportional relationship to each other. Actually, a relationship between the value of the voltage index value register 750 and the actual power supply voltage is determined by an interaction between a DC power supply production circuit in the power supply circuit 760 and all circuits which operate with the power supply.

Operation of the Information Processing System

Figure 12:
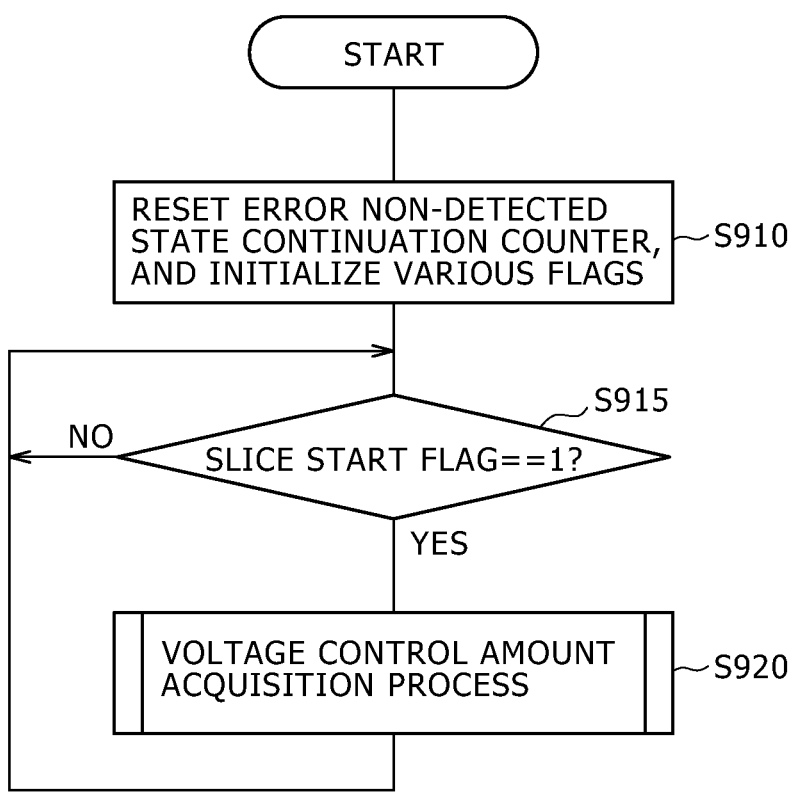
FIG. 12 is a flow chart illustrating an example of operation of a voltage control amount acquisition section of a control amount arithmetic operation section of the control amount outputting section.

Now, operation of the information processing system according to the first embodiment is described with reference to FIGS. 12 to 20. FIG. 12 is a flow chart illustrating an example of operation of the voltage control amount acquisition section 533 in the first embodiment. This operation is started when the power supply voltage $V_{DD}$ is supplied to the information processing apparatus 100 or when an initializing instruction is given to the voltage control amount acquisition section 533.

The voltage control amount acquisition section 533 resets the error non-detected state continuation counter 534 and initializes various flags (step S910). Then, the voltage control amount acquisition section 533 decides whether or not the slice start flag is 1 (step S915).

If the slice start flag is 1 (step S915: Yes), then the voltage control amount acquisition section 533 executes a voltage control amount acquisition process for acquiring a voltage control amount $\Delta V$ (step S20). When the slice start flag is 0 (Step S915: No) or after step S920, the voltage control amount acquisition section 533 returns its processing to step S915.

Figure 13:
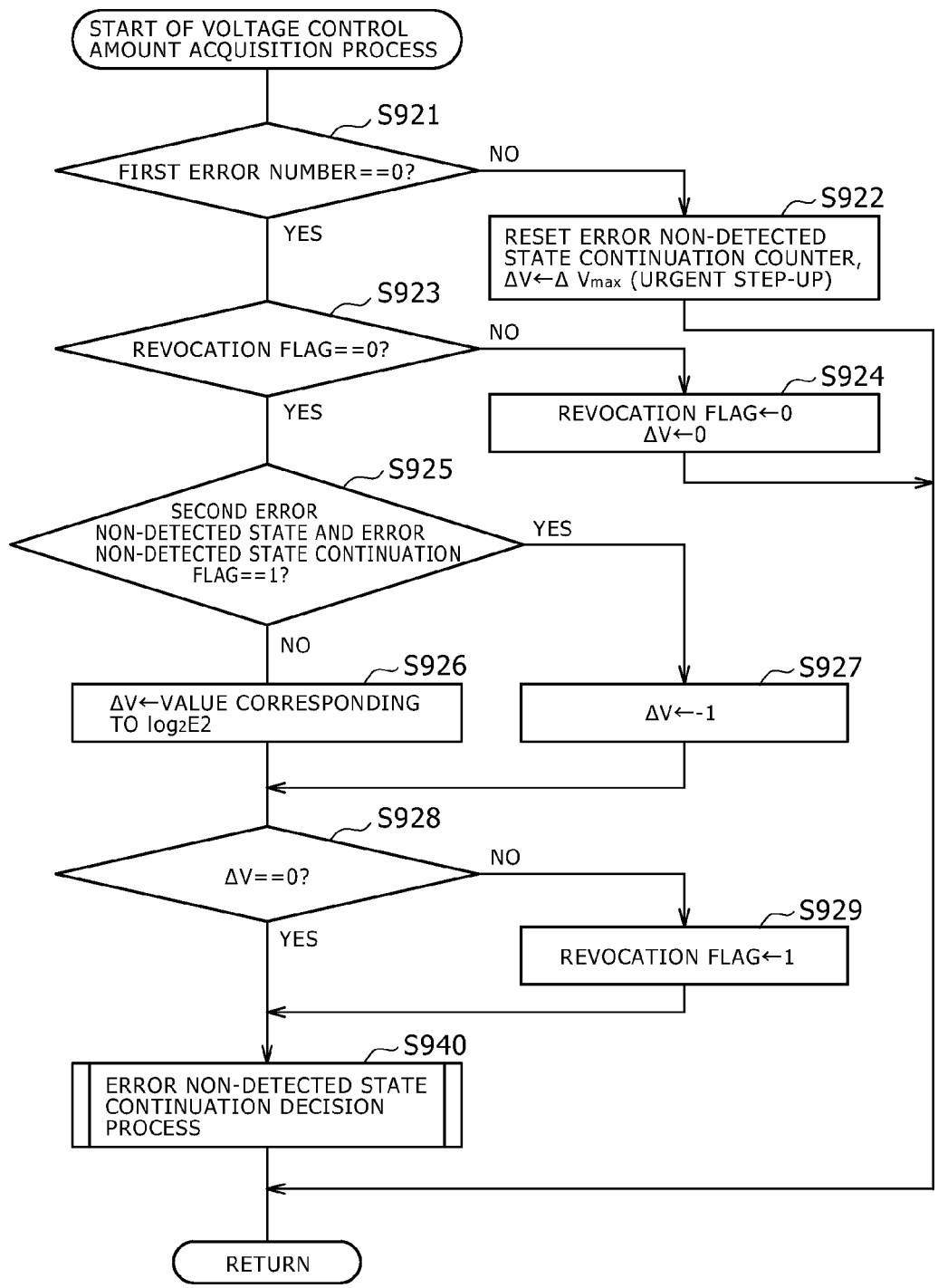
FIG. 13 is a flow chart illustrating an example of a voltage control amount acquisition process in the operation illustrated in FIG. 12.

FIG. 13 is a flow chart illustrating an example of the voltage control amount acquisition process in the first embodiment. Referring to FIG. 13, the voltage control amount acquisition section 533 decides whether or not the first error number is 0 (step S921). If the first error number is not 0 (step S921: No), then the voltage control amount acquisition section 533 resets the error non-detected state continuation counter 534 and outputs the maximum voltage control amount $\Delta V_{max}$ as the voltage control amount $\Delta V$ to try to carry out urgent step-up (step S922).

If the first error number is 0 (step S921: Yes), then the voltage control amount acquisition section 533 decides whether or not a revocation flag is 0 (step S923).

Here, the revocation flag is a flag which is set to 1 when the voltage control amount $\Delta V$ arithmetically operated in the immediately preceding time slice is not 0 but is set to 0 in any other case. The revocation flag is used to set the voltage control amount to 0 within a time slice next to the time slice within which the voltage control amount $\Delta V$ of any other value than 0 is outputted. In the initialization at step S910, the revocation flag is initialized, for example, to 0. It is to be noted that the revocation flag may otherwise be initialized to 1. If instability of the power supply immediately after the system is started up is avoided, then the revocation flag is preferably initialized to 1. In any other case, the revocation flag is initialized to 0.

If the revocation flag is 1 (step S923: No), then the voltage control amount acquisition section 533 sets the revocation flag to 0 and sets the voltage control amount $\Delta V$ to 0 (step S924).

If the revocation flag is 0 (step S923: Yes), then the voltage control amount acquisition section 533 decides whether or not a non-detected state of a second error is found, that is, whether or not the occurrence rate of second errors is equal to or lower than the second threshold value and besides the error non-detected state continuation flag is 1 (step S925).

If a second error is detected or if the error non-detected state continuation flag is 0 (step S925: No), then the voltage control amount acquisition section 533 reads out a value corresponding to the logarithm of the second error number E2 from the voltage control amount conversion table 531. The voltage control amount acquisition section 533 outputs the read out value as the voltage control amount $\Delta V$ (step S926).

If a non-detected state of a second error is found and the error non-detected state continuation flag is 0 (step S925: Yes), then the voltage control amount acquisition section 533 reads out a step-down set value such as, for example, −1 from the voltage control amount conversion table 531 and outputs the value as the voltage control amount $\Delta V$ (step S927).

After step S926 or S927, the voltage control amount acquisition section 533 decides whether or not the voltage control amount $\Delta V$ acquired in the present operation cycle is 0 (step S928). If the voltage control amount $\Delta V$ is not 0 (step S928: No), then the voltage control amount acquisition section 533 sets the revocation flag to 1 (step S929).

After step S929 or when the voltage control amount $\Delta V$ is 0 (step S928: Yes), the voltage control amount acquisition section 533 executes an error non-detected state continuation decision process (step S940). After step S922, S924 or S940, the voltage control amount acquisition section 533 ends the voltage control amount acquisition process.

Figure 14:
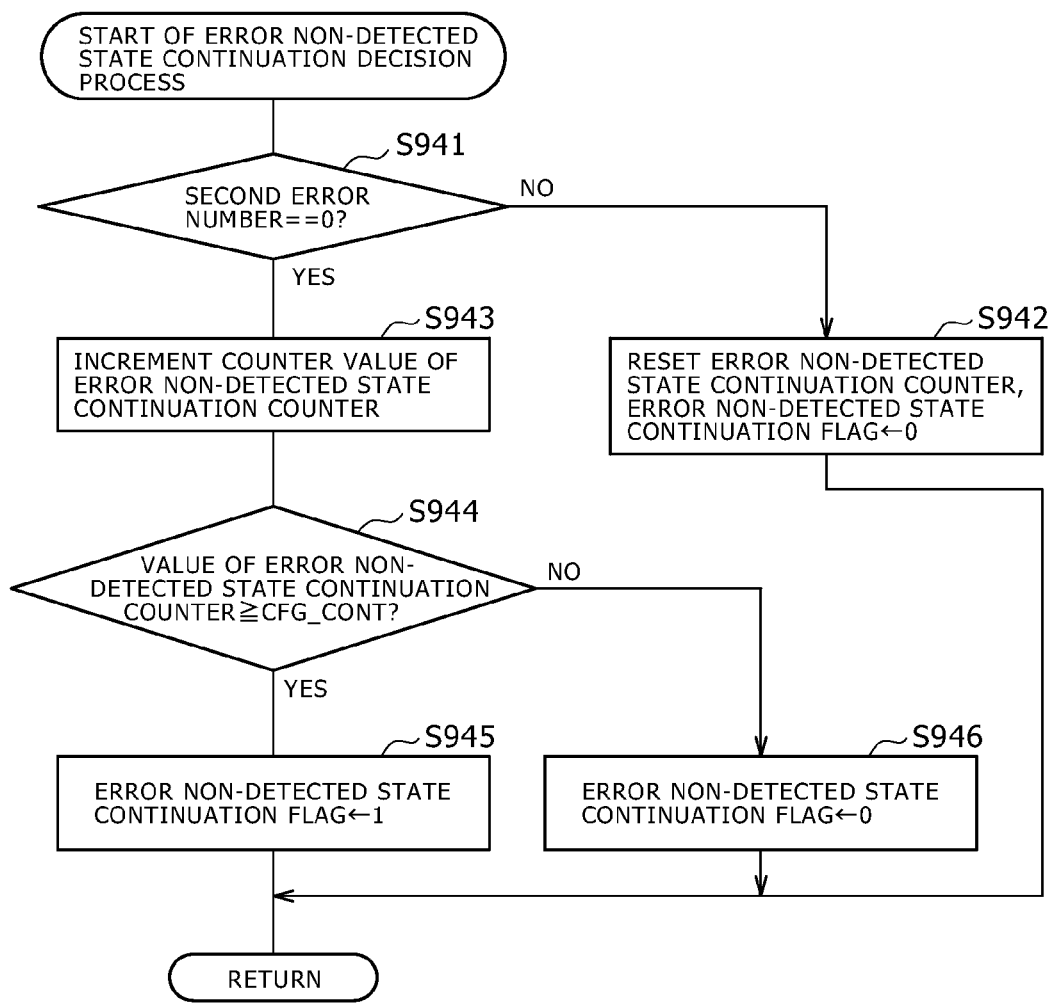
FIG. 14 is a flow chart illustrating an example of an error non-detected state continuation decision process in the voltage control amount acquisition process.

FIG. 14 is a flow chart illustrating an example of an error non-detected state continuation decision process in the first embodiment. Referring to FIG. 14, the voltage control amount acquisition section 533 decides whether or not the second error number is 0 (step S941). If the second error number is not 0 (step S941; No), then the voltage control amount acquisition section 533 resets the error non-detected state continuation counter 534 and sets the error non-detected state continuation flag to 0 (step S942).

If the second error number is 0 (step S941: Yes), then the voltage control amount acquisition section 533 increments the counter value of the error non-detected state continuation counter 534 (step S943). Then, the voltage control amount acquisition section 533 decides whether or not the counter value of the error non-detected state continuation counter 534 is equal to or higher than the time slice number CFG_COUNT (step S944).

If the counter value is equal to or higher than the time slice number CFG_COUNT (step S944: Yes), then the voltage control amount acquisition section 533 sets the error non-detected state continuation flag to 1 (step S945). However, if the counter value is lower than the time slice number CFG_COUNT (step S944: No), then the voltage control amount acquisition section 533 sets the error non-detected state continuation flag to 0 (step S946).

After step S942, S945 or S946, the voltage control amount acquisition section 533 ends the error non-detected state continuation decision process.

Figure 15:
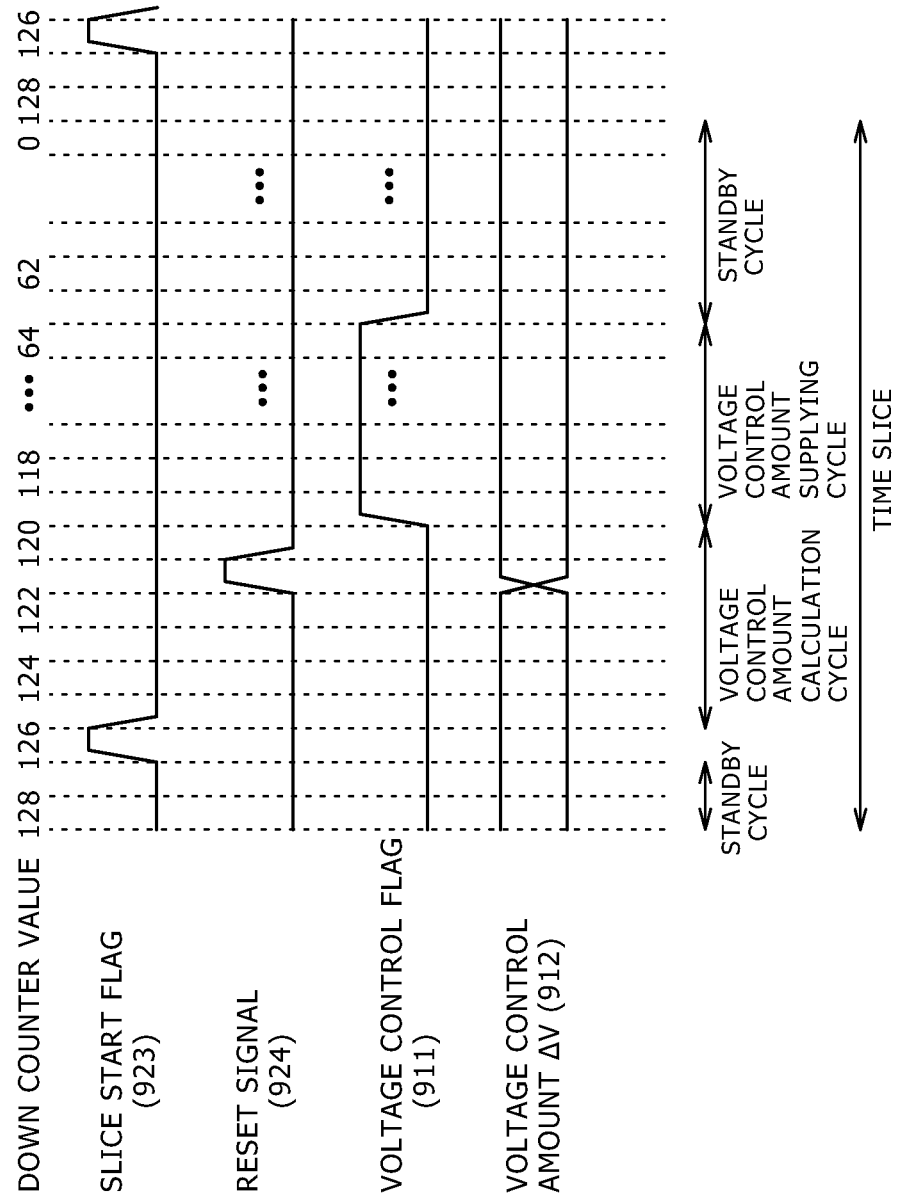
FIG. 15 is a timing chart illustrating an example of operation of the information processing apparatus.

FIG. 15 is a flow chart illustrating an example of operation of the information processing apparatus according to the first embodiment. When a standby cycle within an time slice elapses, the slice start flag production section 522 produces and outputs a slice start flag to the voltage control amount acquisition section 533 through the signal line 923. Then, the slice start flag production section 522 outputs a reset signal through the signal line 924 after the slide start flag is outputted. When the slide start flag is received, the voltage control flag production section 523 reads out a value corresponding to the output value of the logarithm arithmetic operation section 532 from the voltage control amount conversion table 531 and outputs the read out value as the voltage control amount $\Delta V$ through the signal line 912. The output timing of the reset signal is set such that the first error counter 511 and the second error counter 512 are reset after a new voltage control amount $\Delta V$ is arithmetically operated.

After a voltage control amount calculation cycle elapses, the voltage control flag production section 523 starts outputting of the voltage control flag to the power supply apparatus 700 through the signal line 911. When a voltage control supplying cycle elapses, the voltage control flag production section 523 stops the outputting of the voltage control flag. The length of the voltage control supplying cycle is set such that the power supply apparatus 700 can capture a signal transition of the voltage control flag before the voltage control supplying cycle elapses.

Figure 16:
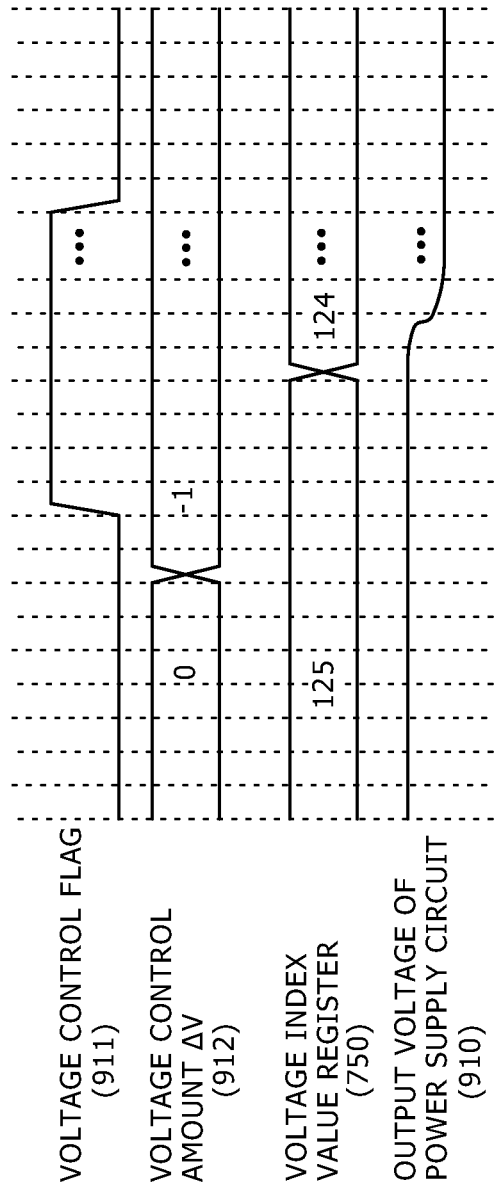
FIG. 16 is a timing chart illustrating an example of operation of the power supply apparatus.

FIG. 16 illustrates an example of operation of the power supply apparatus 700 in the first embodiment. Referring to FIG. 16, a voltage control amount $\Delta V$ is outputted to the power supply apparatus 700 through the signal line 912, and then a voltage control flag is outputted through the signal line 911. If the voltage control flag is received successively, then the state machine 710 updates the value of the voltage index value register 750 into a value obtained by adding the voltage control amount $\Delta V$ to the power supply voltage $V_{DD}$. For example, a case is considered in which the value of the voltage index value register 750 is "125" and a voltage control flag is received after a voltage control amount $\Delta V$ of the value of "−1" is received. In this instance, the value of the voltage index value register 750 is updated to the value of "124." The power supply circuit 760 controls the power supply voltage $V_{DD}$ so as to have the value of the voltage index value register 750 and supplies the controlled power supply voltage $V_{DD}$ to the information processing apparatus 100 through the cable 910.

Figure 17:
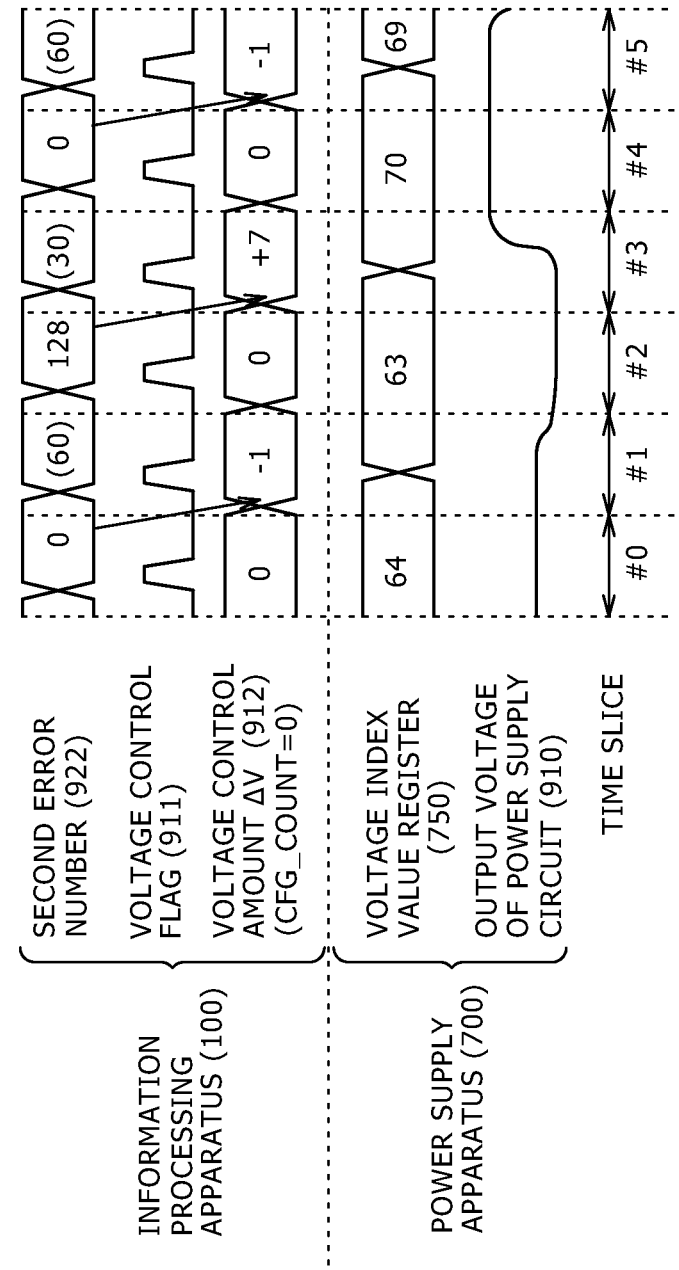
FIG. 17 is a timing chart illustrating an example of operation of the information processing system.

FIG. 17 illustrates an example of operation of the information processing system according to the first embodiment. Referring to FIG. 17, the second error counter 512 counts the number of second errors detected in a time slice and outputs the counter value thereof through the signal line 922. The voltage control amount acquisition section 533 refers to a second error number counted in the time slice in the immediately preceding operation cycle to read out a voltage control amount $\Delta V$ corresponding to the logarithm of the second error number from the voltage control amount conversion table 531 and outputs the read out voltage control amount $\Delta V$ through the signal line 912. After the voltage control amount $\Delta V$ is outputted, the voltage control flag production section 523 outputs a voltage control flag to the power supply apparatus 700 through the signal line 911.

On the other hand, in the power supply apparatus 700, when the state machine 710 receives the voltage control flag, it updates the value of the voltage index value register 750 with a value obtained by adding the power supply voltage $V_{DD}$ to the voltage control amount $\Delta V$. While the power supply circuit supplies power through the cable 910, it controls the power supply voltage $V_{DD}$ so as to be equal to the updated value of the voltage index value register 750.

It is to be noted that, in FIGS. 17 to 20, the first error number counted by the first error counter 511 is omitted. It is assumed that the first error number is 0 in all of the time slices illustrated in FIGS. 17 to 20.

A case is considered in which the time slice number CFG_COUNT is set to 0 and the second error number is "0" within the time slice #0 in FIG. 17. In this instance, since the error non-detected state has continued longer than the time CFG_COUNT, the voltage control amount acquisition section 533 outputs, within the next time slice #1, the step-down set value "−1" as the voltage control amount $\Delta V$. Since a value different from 0 is outputted as the voltage control amount $\Delta V$, within the next time slice #2, the voltage control amount acquisition section 533 sets the voltage control amount ΔV to 0. Although the second error number within the time slice #1 is "60," this second error number is not used in the arithmetic operation within the time slice #2 but is discarded.

On the other hand, in the power supply apparatus 700, when the state machine 710 receives the voltage control flag within the time slice #1, it updates the value of the voltage index value register 750 with a value obtained by adding the present value "64" of the power supply voltage $V_{DD}$ to the voltage control amount ΔV, that is, with "63."

It is assumed that, within the time slice #2, the second error number is "128." Within the next time slice #3, the voltage control amount acquisition section 533 reads out the value "+7" corresponding to the logarithm of the second error number from the voltage control amount conversion table 531 and outputs the value as the voltage control amount ΔV.

On the other hand, in the power supply apparatus 700, when the state machine 710 receives a voltage control amount ΔV within the time slice #3, it updates the value of the voltage index value register 750 with a value obtained by adding the present value "63" of the power supply voltage $V_{DD}$ to the voltage control amount ΔV, which is "+7," that is, with "70."

As seen in FIG. 17, the power supply voltage repeats variation and stabilization within unit periods provided by time slices. Further, even if a voltage control amount ΔV other than 0 is outputted, the power supply voltage does not vary immediately, but some interval of time is required before updating of the power supply voltage is completed. For example, although the voltage index value register 750 is updated from "63" to "70" in the time slice #3, updating of the power supply voltage to a value corresponding to "70" is not completed in the time slice #3. The updating is completed after the time slice #4 is entered. Accordingly, the number of second errors detected in the time slice #3 cannot be regarded as a value corresponding to the power supply voltage of the value corresponding to "70." Therefore, the number of second errors detected in the time slice #3 is not used in arithmetic operation in the time slice #4 but is discarded.

Figure 18:
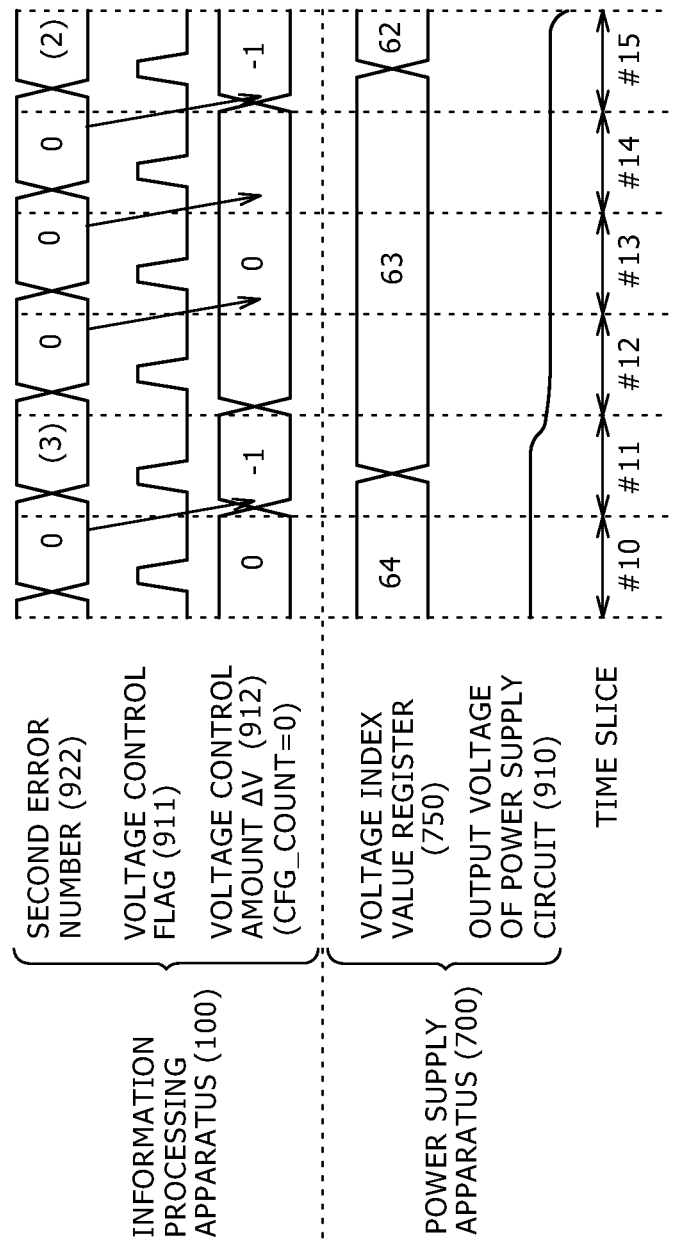
FIG. 18 is a timing chart illustrating an example of operation of the information processing system in a stable state.

FIG. 18 is a timing chart illustrating an example of operation of the information processing system of the first embodiment in a stable state. Referring to FIG. 18, a case is considered in which the value CFG_COUNT is set to 2 and the step-down set value "−1" is set within the time slice #11. Since a value different from 0 is set as the voltage control amount ΔV, within the next time slice #12, the voltage control amount acquisition section 533 sets the voltage control amount ΔV to "0." The second error number "3" counted in the time slice #11 is discarded. Further, it is assumed that, also within the time slices #12 and #13, the second error number is "0." In this instance, within the time slices #12 and #13, the continuation period of the error non-detected state is shorter than the period of the time slice number CFG_COUNT, which is "2," and the second error number is 0. Therefore, within the time slices #13 and "14, the voltage control amount ΔV is set to "0." Within the time slice #15, the continuation period of the error non-detected state is equal to or longer than the period of the time slice number CFG_COUNT, and since the second error number in the immediately preceding time slice is 0, the voltage control amount acquisition section 533 outputs the step-down set value "−1" as the voltage control amount ΔV.

As seen from the time slices #12 to #14 in FIG. 18, although the voltage control amount ΔV is arithmetically operated, if the value thereof is "0," then a substantial voltage variation does not occur. Accordingly, in such an instance, the control amount arithmetic operation section 530 can successively carry out, within the time slices #13 to #15, arithmetic operation referring to the error number in the individually immediately preceding time slices.

Figure 19:
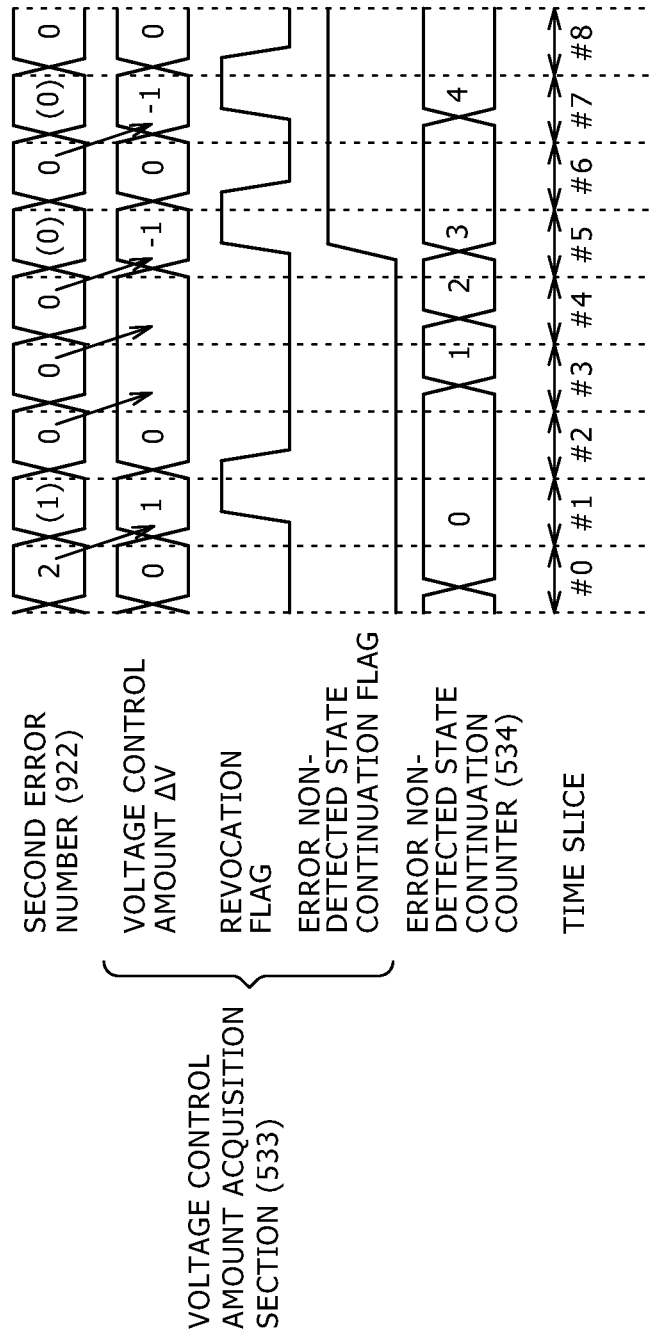
FIG. 19 is a timing chart illustrating an example of operation of the control amount arithmetic operation section.

FIG. 19 is a timing chart illustrating an example of operation of the control amount arithmetic operation section 530 in the first embodiment. Referring to FIG. 19, a case is considered in which the time slice number CFG_COUNT is set to 2 and "1" is outputted as the voltage control amount ΔV within the time slice #1. Since the voltage control amount ΔV is not 0, the voltage control amount acquisition section 533 sets the revocation flag to "1." Within the next time slice #2, since the revocation flag is 1, the voltage control amount acquisition section 533 sets the voltage control amount ΔV to 0 irrespective of the second error number.

Within the time slices #2 and #3, since the second error number is "0," the voltage control amount acquisition section 533 increments the error non-detected state continuation counter 534 within the time slices #3 and #4. As a result, within the time slice #5, the counter value of the error non-detected state continuation counter 534 becomes equal to or higher than the value CFG_COUNT, which is "2." In addition, since the second error number counted in the immediately preceding time slice #4 is 0, the voltage control amount acquisition section 533 outputs the step-down set value "−1" as the voltage control amount ΔV. Also in the succeeding time slices, as long as the second error number is "0," the error non-detected state continuation counter 534 is incremented, and the voltage control amount ΔV is set to the step-down set value "−1" in every other time slice.

As seen in FIG. 19, if the error non-detected state of the first and second errors continues for more than the period of the time slice number CFG_COUNT, then a step-down mode in which the power supply voltage is stepped down gradually is entered and continues as long as a first error or a second error becomes not detected any more.

Figure 20:
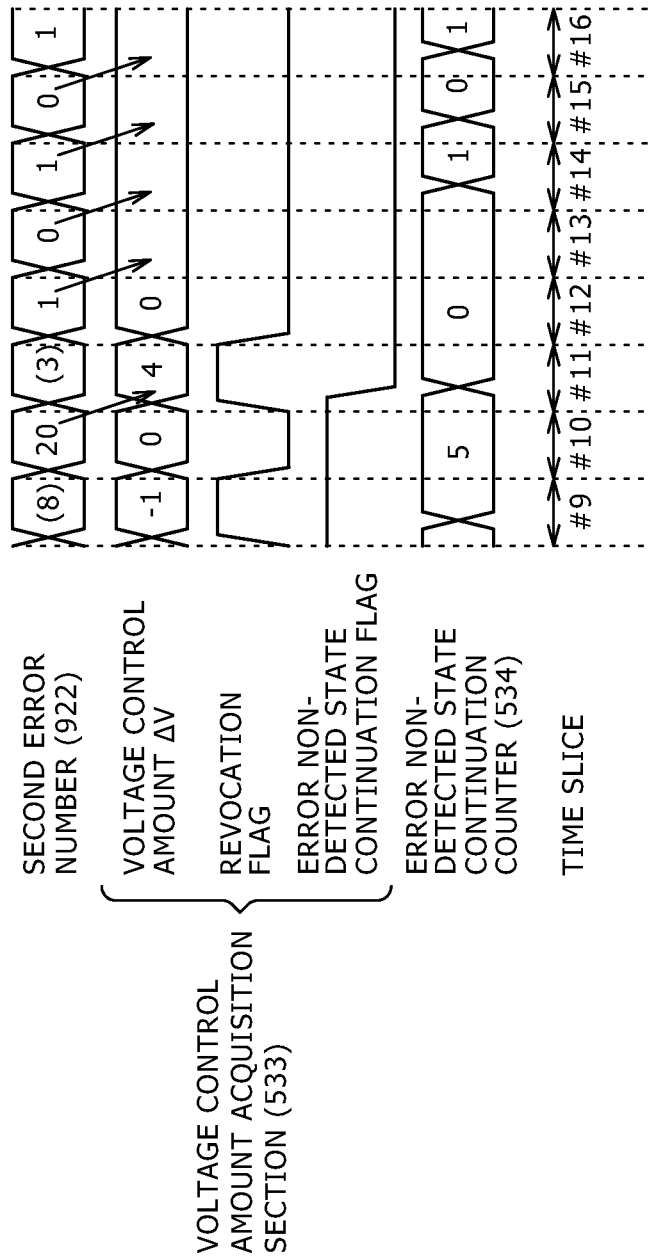
FIG. 20 is a timing chart illustrating an example of operation of the control amount arithmetic operation section in a stable state.
Figure 23:
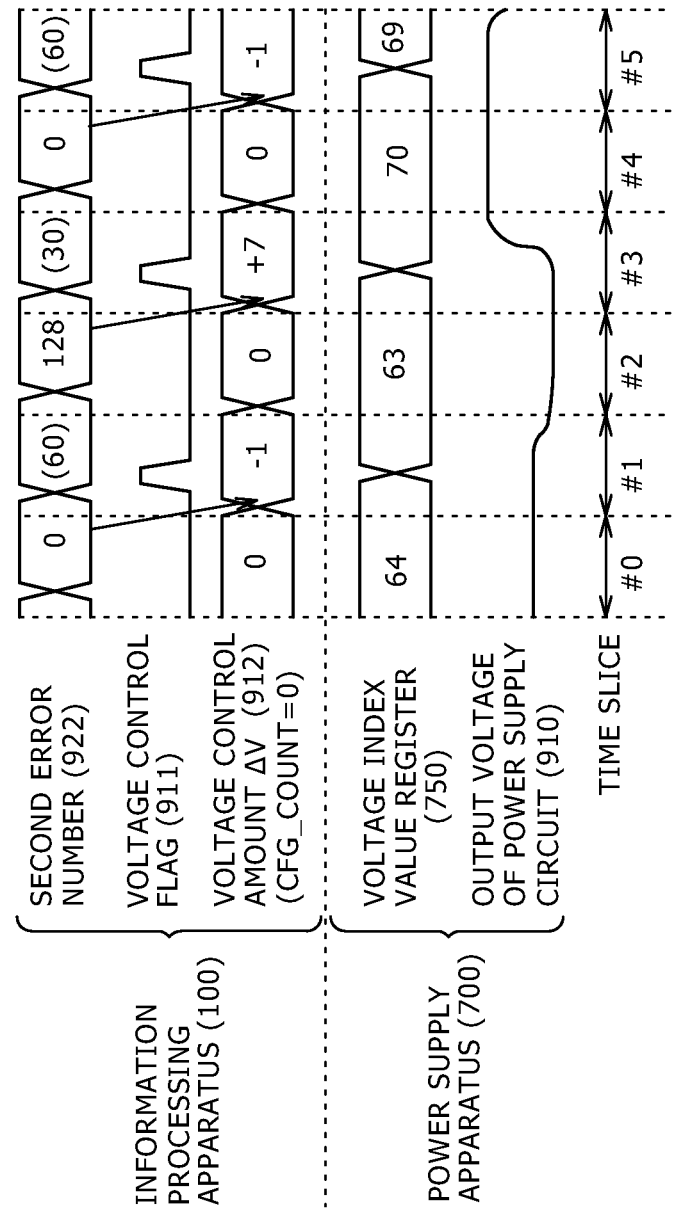
FIG. 23 is a timing chart illustrating an example of a modified information processing system.

FIG. 20 is a timing chart illustrating an example of operation of the control amount arithmetic operation section 530 in a stable state in the first embodiment. In particular, FIG. 20 illustrates operation of the control amount arithmetic operation section 530 after the immediately preceding time slice #8 in FIG. 19. When the power supply voltage gradually steps down as seen in FIG. 19, a first error or a second error occurs soon. In FIG. 20, although a first error is not detected, a second error number is counted as "20" in the time slice #10. In this instance, within the time slice #11, the voltage control amount acquisition section 533 reads out "4" corresponding to the logarithm of the second error number from the voltage control amount conversion table 531 and outputs the value "4" as a voltage control amount ΔV. By the step-up of the power supply voltage $V_{DD}$, the rate of occurrence of errors decreases, and after the time slice #12, the second error number is counted alternately as "1" and "0." In the case where the second error number is alternately counted as "1" and "0," when the second error number is "1," the voltage control amount acquisition section 533 resets the error non-detected state continuation counter 534, and consequently, the counter value does not become equal to or higher than the value CFG_COUNT. Accordingly, a step-down set value is not outputted. Further, since the second error number is equal to or lower than the value corresponding to the second threshold value 1/129, that is, equal to or lower than "1," the voltage control amount ΔV is set to 0. As a result, unless the second error number becomes greater than 1, a stable state in which the power supply voltage $V_{DD}$ does not vary continues.

Now, a significance of production of a second parity bit is described with reference to FIGS. 21 and 22. FIG. 21 is a table in which causes of a malfunction of the information processing apparatus are listed. As seen in FIG. 21, errors which cause a malfunction can be classified into timing violative errors and other errors. The timing violative errors include a setup violative error, a hold violative error and a minimum pulse width violative error. The errors other than the timing violative errors include an F/F retentive error and a logic gate DC transmission characteristic error.

The setup violative error is an error which occurs when the period of time within which an outputting side circuit should continue to output a data signal, that is, setup time, is shorter than a designed value therefor prior to a timing at which an instruction to take in data is issued to the inputting side.

For example, a case is considered in which, in the information processing apparatus 100 illustrated in FIG. 1, the delay amount of a transition timing of data from the computing unit 310 from a timing of a transition of a certain clock signal CLK becomes a comparatively great amount. In this instance, the period of time, that is, setup time, within which the computing unit 310 should continue to output data prior to a timing of a transition of a next clock signal CLK sometimes becomes shorter than a designed value therefor. As a result, a wrong value is retained into the pipeline register 220, resulting in occurrence of a setup violative error.

The hold violative error illustrated in FIG. 21 is an error which occurs when the period of time, that is, holdup time, within which the inputting side circuit should continue to hold data after it is instructed to take in data, is shorter than a designed value therefor.

The minimum pulse width violative error is an error which occurs when the pulse width of a clock signal becomes smaller than a minimum pulse width defined by a flip-flop because of disorder of the duty ratio of a clock supply or by a like reason.

The F/F retentive error is an error which occurs when the period within which a flip-flop retains a same value becomes shorter than a designed value therefor.

The logic gate DC transfer characteristic error is an error which occurs when the potential corresponding to "0" or "1" on a logic circuit becomes incomplete and does not exhibit a full potential such as a power supply potential or the potential of the ground.

As seen in FIG. 21, a method of slowing down the operation frequency or another method of stepping up the power supply voltage $V_{DD}$ is available as a dynamic technique for relaxing errors. As a static technique for relaxing errors, a method of increasing a setup margin or another method of increasing a hold margin is available. When the static technique is difficult, such a dynamic technique as to step up the power supply voltage $V_{DD}$ is selected.

In the case where the power supply voltage $V_{DD}$ is stepped up to relax errors, the rate of occurrence of errors is measured for each power supply voltage $V_{DD}$, and a power supply voltage with which no malfunction occurs is estimated from a result of the measurement.

The information processing apparatus 100 can detect the various types of errors illustrated in FIG. 22 by carrying out a parity check. Particularly, the information processing apparatus 100 produces a second parity bit from first parity bits. Therefore, the information processing apparatus 100 can detect a setup violative error with a high degree of certainty in comparison with that in an alternative case in which only first parity bits are produced.

The reason why a setup violative error can be detected with certainty by the production of a second parity bit is described. The period of the clock signal CLK is represented by tCK, and the delay time of a transition timing of the computing unit 310 is tDP_max. The production timing of first parity bits is delayed with respect to the production timing of data by the computing unit 310. This delay time is represented by tST1. Since the second parity bit is produced from the first parity bits, the production timing of the second parity bit is delayed from the production timing of the first parity bits. This delay time is represented by tST2. Here, a clock period tCK1 which satisfies conditions of $tCK1 > tDP\_max$ and $tCK1 \leq (tDP\_max + tST1)$ is assumed. Since tCK1>tDP_max, a result of the arithmetic operation is written into the pipeline register 220. Since tCK1≤(tDP_max+tST1), production of the first parity bits is not carried out in time, and a first error is detected. If the clock period is so short that production of a first parity bit is not carried out in time although production of data is carried out in time, then a setup violative error can be detected by a parity check based on the first parity bits. Now, a clock period tCK2 (>tCK1) which satisfies conditions of $tCK2 > (tDP\_max + tST1)$ and $tCK2 \leq (tDP\_max + tST1 + tST2)$ is assumed. Since tCK2>(tDP_max+tST1), a result of the arithmetic operation and the first parity bits are written into the pipeline register 220. However, since tCK2≤(tDP_max+tST1+tST2), production of a second parity bit is not carried out in time and a second error is detected. In this manner, in the case of such a clock period (tCK2) that production of a second parity bit is not carried out in time although production of a first parity bit is carried out in time, although an error is not detected with first parity bits, a setup violative error is detected from a second parity bit. Accordingly, the information processing apparatus 100 can detect a setup violative error with a higher degree of certainty by producing a second parity bit.

The information processing apparatus 100 not only can detect a setup violative error with certainty through a second parity bit as described above, but also can detect various kinds of errors other than setup violative errors from a first parity bit. In contract, as summarized in FIG. 22, in the technique which uses an EDS and a TRC mentioned hereinabove, only a setup violative error can be detected. Further, in a TD circuit described hereinabove, only a setup violative error and a hold violative error can be detected.

In this manner, with the first embodiment, the information processing apparatus 100 detects a first error using first parities and detects a second error using a second parity produced from the first parities. Then, when the production rate of first errors is equal to or lower than the first threshold value, the information processing apparatus 100 outputs a voltage control amount for controlling the power supply voltage using the second threshold value as a target value of the production rate of a second error. Consequently, a timing violative error which cannot be detected by a check in which first parity bits are used can be detected using a second parity bit. Accordingly, by outputting a voltage control amount for controlling the production rate of a second error detected using a second parity bit to the second threshold value, occurrence of a timing violative error can be prevented. Further, different from an EDS and a TRC or a TD circuit, the information processing apparatus 100 need not include a special flip-flop. Therefore, the information processing apparatus 100 may be comparatively small in circuit scale. Further, the information processing apparatus 100 can detect not only a timing violative error but also errors other than a timing violative error from a first parity bit. Accordingly, an accurate power supply voltage with which a malfunction does not occur can be set readily.

Further, the control amount outputting section 500 includes a first error counter 511 and a second error counter 512 for counting the number of first errors and second errors detected within a time slice. Consequently, the control amount outputting section 500 can determine an error occurrence rate during operation of the information processing apparatus 100 and dynamically control the power supply voltage.

Further, the voltage control amount acquisition section 533 acquires a voltage control amount $\Delta V$ corresponding to the logarithm of a second error number arithmetically operated by the logarithm arithmetic operation section 532 from the voltage control amount conversion table 531. Consequently, the voltage control amount acquisition section 533 need not arithmetically operate a voltage control amount $\Delta V$ from a logarithm and can acquire a voltage control amount $\Delta V$ readily.

Meanwhile, the logarithm arithmetic operation section 532 subtracts 1 from the most significant one of those bits which have the value of 1 from within a bit string which represents a second error number in a binary number and outputs a resulting value as a logarithm of the second error number. Consequently, the logarithm arithmetic operation section 532 can calculate a logarithm of a second error number readily by simple and easy bit arithmetic operation.

Further, if the rate of occurrence of a first error is higher than the first threshold value, then the control amount outputting section 500 outputs a voltage control amount $\Delta V_{max}$ for stepping up the power supply voltage by a predetermined voltage. Consequently, it can be prevented with a higher degree of certainty that a malfunction occurs with the information processing apparatus 100.

Further, if the control amount outputting section 500 does not detect an error for a predetermined decision reference period, for example, for the period of the time slice number CFG_COUNT, then it outputs a voltage control amount $\Delta V$ for stepping down the power supply voltage by a predetermined voltage. Consequently, the arithmetic operation process efficiency with respect to power consumption can be improved while a malfunction is prevented.

Further, if the voltage control amount $\Delta V$ produced in the immediately preceding time slice is 0, then the control amount arithmetic operation section 530 arithmetically operates and outputs the voltage control amount $\Delta V$ in the present operation cycle based on a relationship between the occurrence rate of second errors and the power supply voltage. With the configuration just described, arithmetic operation of a voltage control amount based on the number of errors detected during updating of the power supply voltage is eliminated, and an accurate voltage control amount $\Delta V$ can be outputted.

It is to be noted that, although the information processing apparatus 100 uses a parity bit for error detection, also it is possible to use an error detection signal other than a parity bit if an error can be detected. For example, the information processing apparatus 100 may use a check sum or a hash function to detect an error.

Further, while, in the information processing apparatus 100, data and parity bits are retained in the pipeline registers 210 and 220, the device for retaining data and so forth is not limited to a pipeline register.

Further, while, in the information processing apparatus 100, data is processed by the computing unit 310, data can be processed otherwise by a circuit other than a computing unit.

Further, the voltage control amount acquisition section 533 acquires a voltage control amount corresponding to a logarithm of a second error number from the voltage control amount conversion table 531. However, the voltage control amount acquisition section 533 may not include the voltage control amount conversion table 531 but may carry out arithmetic operation for a logarithm of a second error number to produce a voltage control amount. For example, it is possible for the voltage control amount acquisition section 533 to define a relationship expression indicative of a proportional relationship between the logarithm of the second error number and the voltage control amount illustrated in FIG. 9 and substitute a logarithm of a second error number into the relationship expression to carry out an arithmetic operation to produce a voltage control amount $\Delta V$.

Further, the information processing apparatus 100 facilitates acquisition of a voltage control amount $\Delta V$ by approximating an exponential relationship between the rate of occurrence of second errors and the power supply voltage to a proportional relationship between a logarithm of the rate of occurrence of second errors and the power supply voltage. However, the information processing apparatus 100 can carry out approximation by arithmetic operation other than the arithmetic operation of determining a logarithm of the rate of occurrence of second errors if acquisition of a voltage control amount $\Delta V$ is facilitated.

Further, while the logarithm arithmetic operation section 532 arithmetically operates a logarithm by subtracting 1 from the most significant one of those digits which have the value of 1 in a bit string, a logarithm may otherwise be arithmetically operated by any other arithmetic operation method.

Further, while the time slice controlling section 520 sets the length of a time slice to 129, the length of a time slice can be set arbitrarily. Also the start timing or length of each cycles such as standby cycle within a time slice can be set arbitrarily.

Further, while the information processing apparatus 100 carries out urgent step-up when the first error is equal to or greater than 1, also it is possible to execute an error recovery process, a restoration process and so forth in addition to urgent step-up.

Further, the time slice controlling section 520 produces a voltage control flag at a predetermined timing within each time slice. However, also it is possible for the time slice controlling section 520 to refer to an arithmetically operated voltage control amount $\Delta V$ and produce a voltage control flag only when the voltage control amount $\Delta V$ is not 0.

Figure 24:
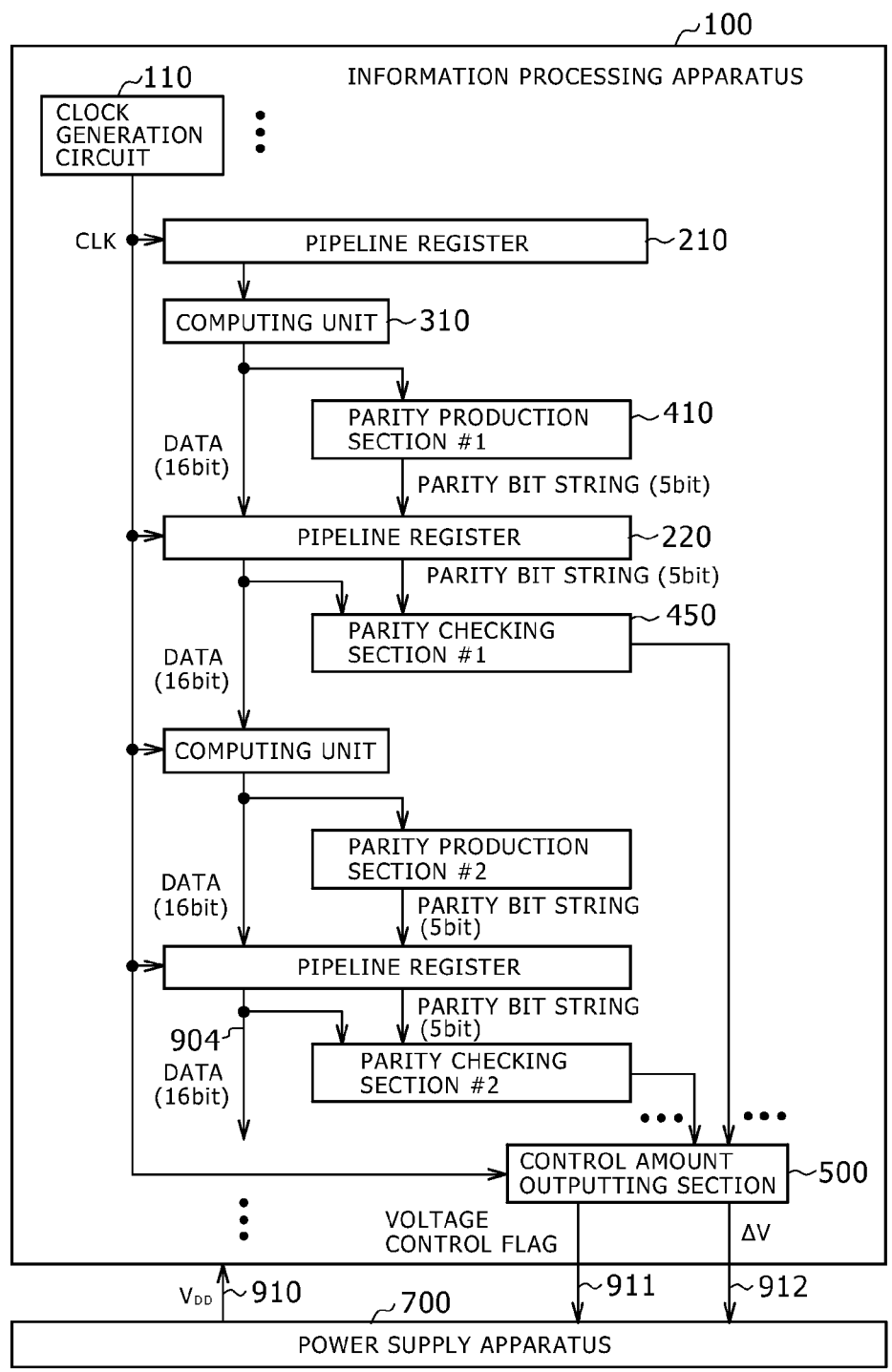
FIG. 24 is a block diagram showing an example of a configuration of the modified information processing system.

Further, while the information processing apparatus 100 includes one parity production section and one parity checking section, it may otherwise include a plurality of parity production sections and a plurality of parity checking sections as seen in FIG. 24. The parity production sections #1 and #2 shown in FIG. 24 have a configuration similar to that of the parity production section 410 shown in FIG. 1. Further, the parity checking sections #1 and #2 shown in FIG. 24 have a configuration similar to that of the parity checking section 450 shown in FIG. 1. In this instance, each of first error detection information and second error detection information is produced in a plurality of bits. In this instance, the control amount outputting section 500 adds a total value of first errors detected in each pipeline in each clock cycle to the counter value of the first error counter. Also with regard to the second error, a total value of second errors detected in each pipeline in each clock cycle is added to the counter value of the second error counter.

Figure 25:
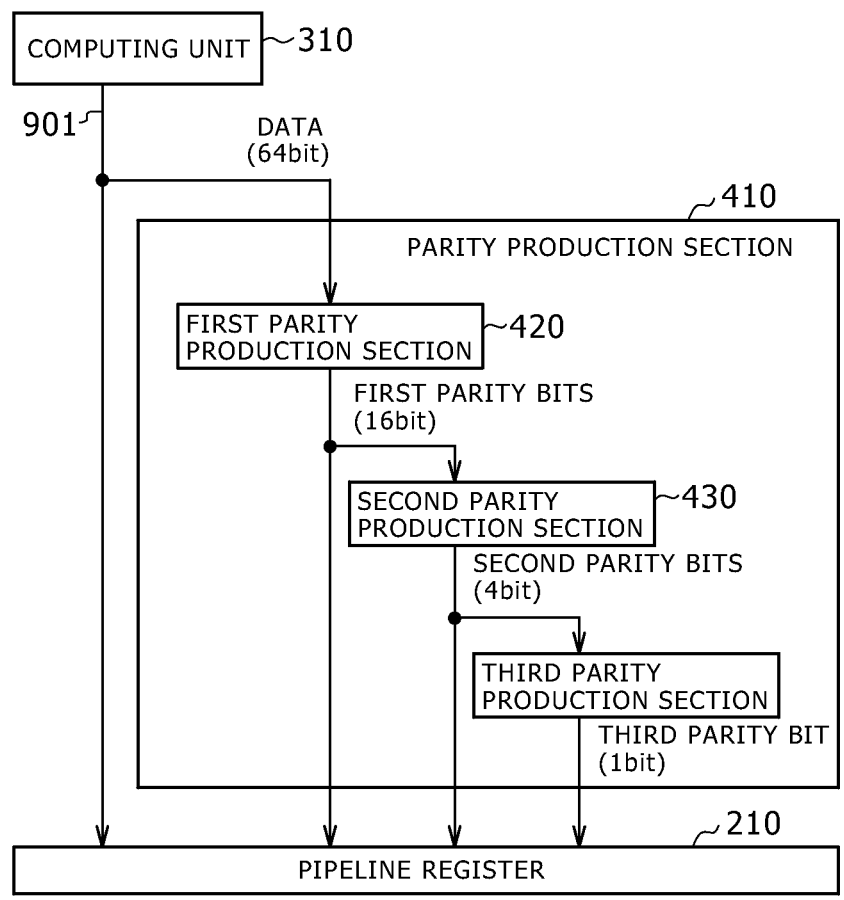
FIG. 25 is a block diagram showing an example of a configuration of a parity production section in the modified information processing system.

Further, while the information processing apparatus 100 produces a second parity bit from first parity bits, a further parity bit may be produced from second parity bits. For example, a parity production section shown in FIG. 25 produces 16 first parity bits from data of 64 bits and produces four second parity bits from the first parity bits. Further, the parity production section produces one third parity bit from the second parity bits. Since the third parity bit is delayed further from the second parity bits, the information processing apparatus 100 can detect a setup violative error, which cannot be detected from the second parity bits, with certainty from the third parity bit.

Further, the information processing apparatus 100 produces 4 first parity bits and one second parity bit from data of 16 bits. However, the number of bits of data and parity bits is determined arbitrarily. For example, it is possible for the information processing apparatus 100 to produce 8 first parity bits and one second parity bits from data of 32 bits. The number of bits from which a parity bit should be produced can be determined appropriately in accordance with an object and a situation based on a tradeoff relationship between the error detection ratio and the hardware overhead.

2. Second Embodiment

Operation of the Information Processing Apparatus

Figure 26:
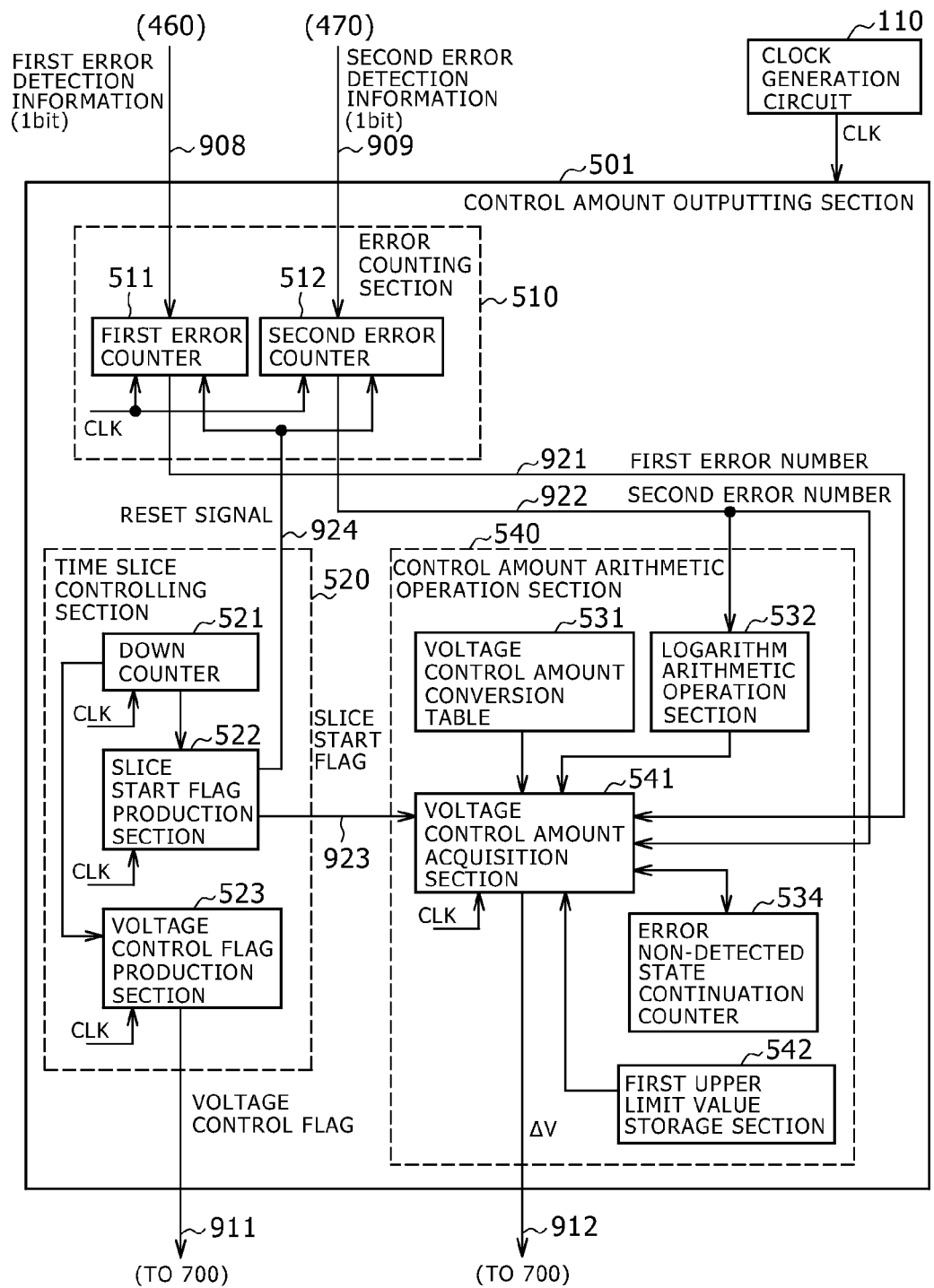
FIG. 26 is a block diagram showing an example of a configuration of a control amount outputting section of an information processing apparatus according to a second embodiment of the disclosed technology.

A second embodiment of the disclosed technology is described below with reference to FIGS. 26 to 28. The information processing apparatus of the second embodiment is different from the information processing apparatus of the first embodiment in that it further carries out control for suppressing increase of the second error number. FIG. 26 is a block diagram showing an example of a configuration of a control amount outputting section 501 in the second embodiment. The control amount outputting section 501 is different from the control amount outputting section 500 in the first embodiment in that it includes a control amount arithmetic operation section 540 in place of the control amount arithmetic operation section 530. The control amount arithmetic operation section 540 is different from the control amount arithmetic operation section 530 in the first embodiment in that it includes a voltage control amount acquisition section 541 and a first upper limit value storage section 542 in place of the voltage control amount acquisition section 533.

The first upper limit value storage section 542 stores a first upper limit value. This first upper limit value is an allowance for the second error number and is set to an integer equal to or higher than 0. The voltage control amount acquisition section 541 is different from the voltage control amount acquisition section 533 in that, if the second error number is equal to or higher than the first upper limit value read out from the first upper limit value storage section 542, then the voltage control amount acquisition section 541 carries out step-up quickly irrespective of the revocation flag.

Figure 27:
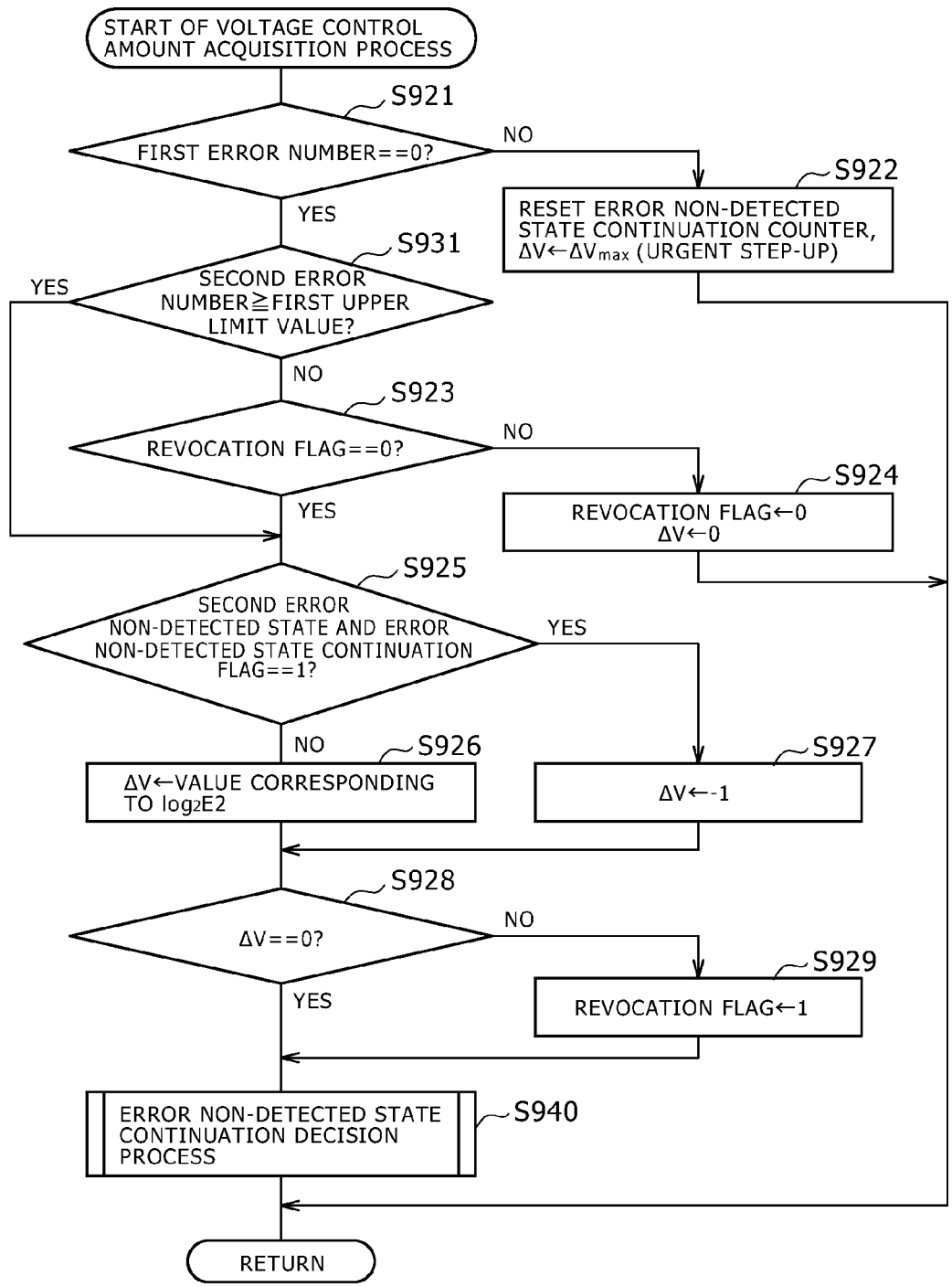
FIG. 27 is a flow chart illustrating an example of a voltage control amount acquisition process of the control amount outputting section shown in FIG. 26.

FIG. 27 is a flow chart illustrating an example of a voltage control amount acquisition process in the second embodiment. The voltage control amount acquisition process in the second embodiment is different from the voltage control amount acquisition process in the first embodiment in that processing at step S931 is executed additionally.

If the first error number is 0 (step S921: Yes), then the voltage control amount acquisition section 541 decides whether or not the second error number is equal to or higher than the first upper limit value (step S931). If the second error number is equal to or higher than the first upper limit value (step S931: Yes), then the voltage control amount acquisition section 541 decides whether or not a second error is not detected as yet and besides the error non-detected state continuation flag is 1 (step S925). If the second error number is lower than the first upper limit value (step S931: No), then the voltage control amount acquisition section 541 decides whether or not the revocation flag is 0 (step S923).

As illustrated in FIG. 27, if the second error number is equal to or higher than a certain fixed number, that is, the first upper limit value, at step S931, then the voltage control amount acquisition section 541 carries out step-up quickly irrespective of the revocation flag. In the first embodiment, the step S931 is not provided, and consequently, the voltage control amount acquisition section 541 refers to the revocation flag and sets, if the voltage control amount $\Delta V$ in the preceding operation cycle is not 0, the voltage control amount $\Delta V$ to 0. With this configuration, even if the second error number increases in the time slice after a voltage control amount $\Delta V$ other than 0 is outputted, the second error number is not referred to but is revoked. If the process at step S931 is executed, then even in a time slice after a voltage control amount $\Delta V$ other than 0 is outputted, if the second error number is equal to or greater than a certain fixed number, then step-up is carried out and increase of the second error number is prevented.

Figure 28:
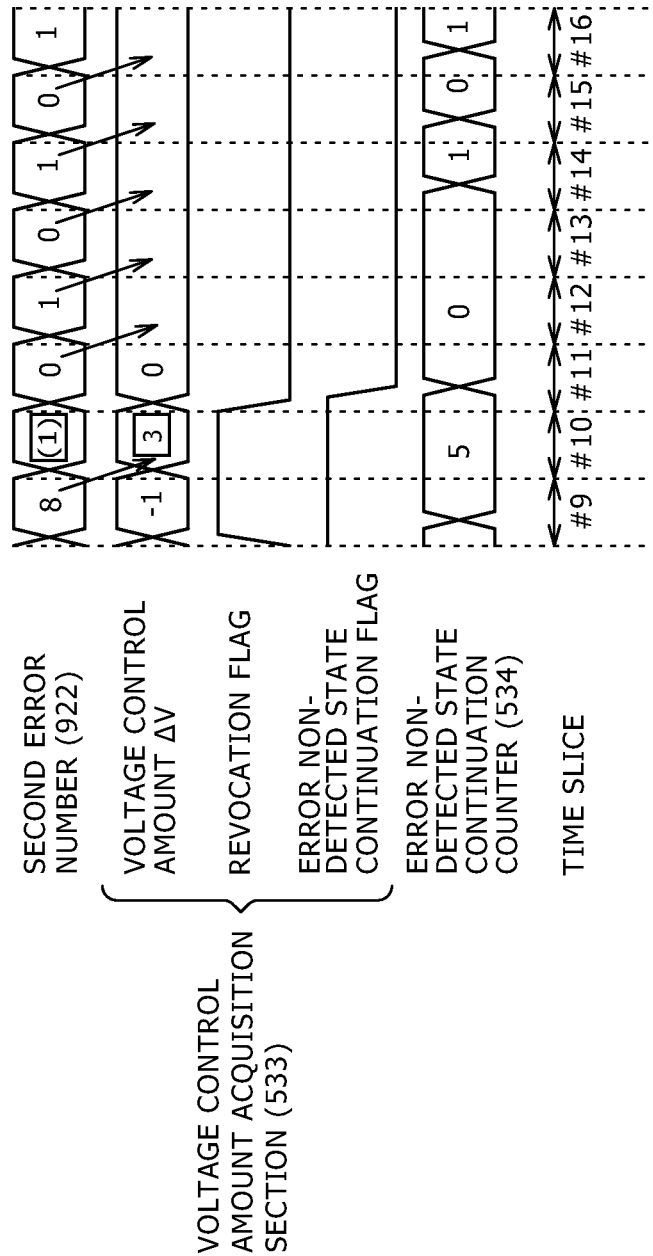
FIG. 28 is a timing chart illustrating an example of operation a voltage control amount arithmetic operation of the control amount outputting section shown in FIG. 26.

FIG. 28 is a timing chart illustrating an example of operation of the control amount arithmetic operation section 540 in the second embodiment. Referring to FIG. 28, since "−1" is outputted within the time slice #9, the revocation flag is updated to 1. Since, within the next time slice #10, the second error number, which is "8," is equal to or greater than the first upper limit value, for example, "5," the voltage control amount acquisition section 541 outputs the value "3" corresponding to the logarithm of the second error number as the voltage control amount $\Delta V$ irrespective of the value of the revocation flag. As a result, the second error number decreases to "1" in the time slice #10.

In the first embodiment, as illustrated in FIG. 20, within the time slice #10 after "−1" is outputted as the voltage control amount $\Delta V$, the voltage control amount acquisition section 541 sets the voltage control amount $\Delta V$ to 0 irrespective of the second error number because the revocation flag is 1. As a result, in the time slice #10, the second error number increases and "20" are counted. In contrast, in the second embodiment, as illustrated in FIG. 28, within the time slice #10 after "−1" is outputted as the voltage control amount $\Delta V$, the voltage control amount acquisition section 541 attempts to carry out step-up in response to the second error number irrespective of the revocation flag. Accordingly, increase of the second error number is prevented.

In this manner, with the second embodiment, when the second error number is equal to or greater than the first upper limit value, or when the voltage control amount $\Delta V$ in the immediately preceding cycle is 0, the voltage control amount acquisition section 541 acquires a voltage control amount $\Delta V$ in accordance with the second error number. Therefore, increase of the second error number is prevented.

3. Third Embodiment

Operation of Information Processing Apparatus

Figure 29:
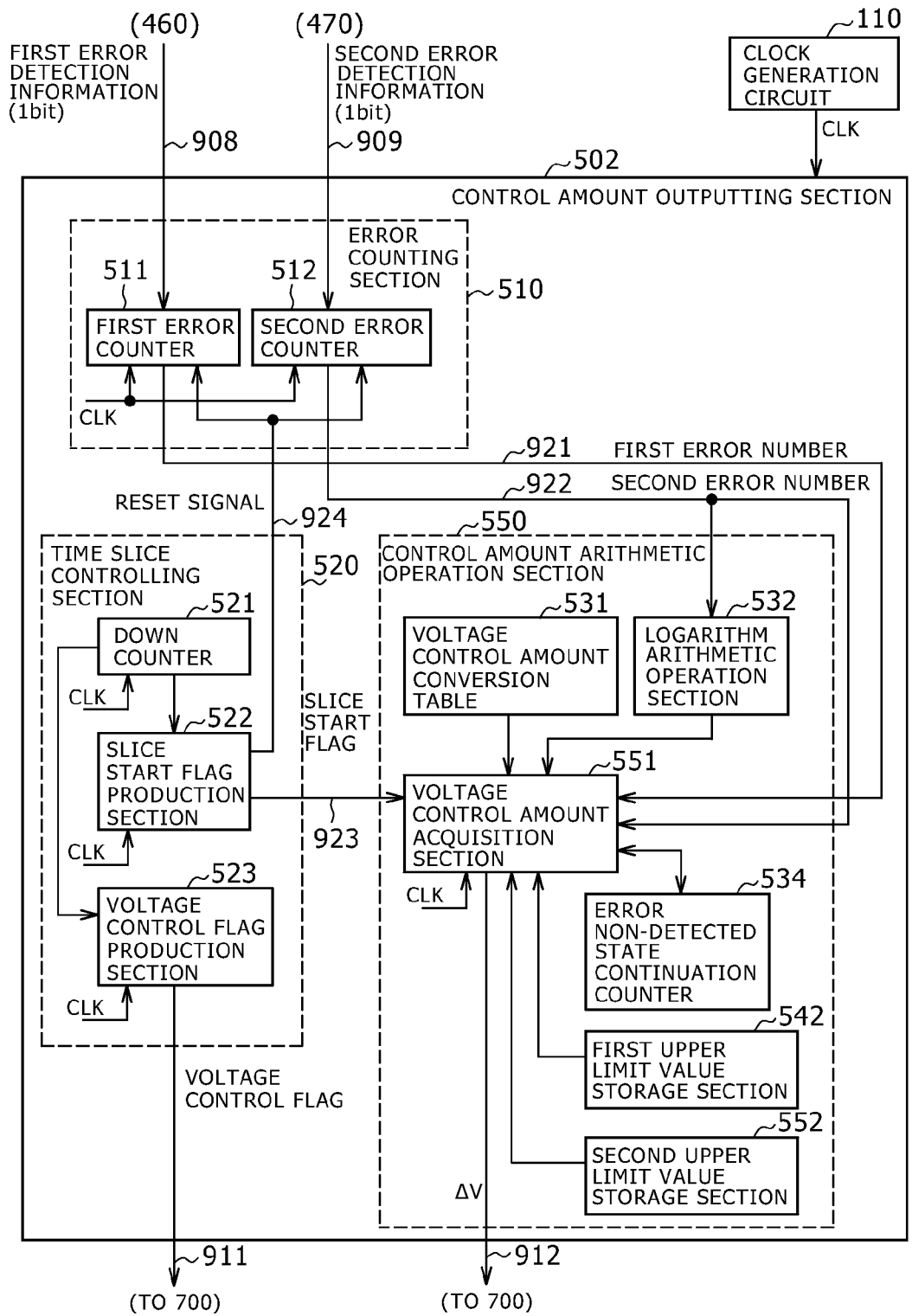
FIG. 29 is a block diagram showing an example of a configuration of a control amount outputting section in an information processing apparatus according to a third embodiment of the disclosed technology.

A third embodiment of the disclosed technology is described with reference to FIGS. 29 to 31. The information processing apparatus 100 in the third embodiment is different from the information processing apparatus 100 in the second embodiment in that it further carries out control for preventing occurrence of a first error. FIG. 29 shows an example of a configuration of a control amount outputting section 502 in the second embodiment. The control amount outputting section 502 is different from the control amount outputting section 501 in the first embodiment in that it includes a control amount arithmetic operation section 550 in place of the control amount arithmetic operation section 540. The control amount arithmetic operation section 550 is different from the control amount arithmetic operation section 540 in the second embodiment in that it includes a voltage control amount acquisition section 551 and a second upper limit value storage section 552 in place of the voltage control amount acquisition section 541.

The second upper limit value storage section 552 stores a second upper limit value. This second upper limit value is an allowance for the second error number and is set to an integer higher than the first upper limit value. The voltage control amount acquisition section 551 is different from the voltage control amount acquisition section 541 in the second embodiment in that it attempts to carry out urgent step-up when the rate of occurrence of second errors is equal to or higher than the second upper limit value read out from the second upper limit value storage section 552.

Figure 30:
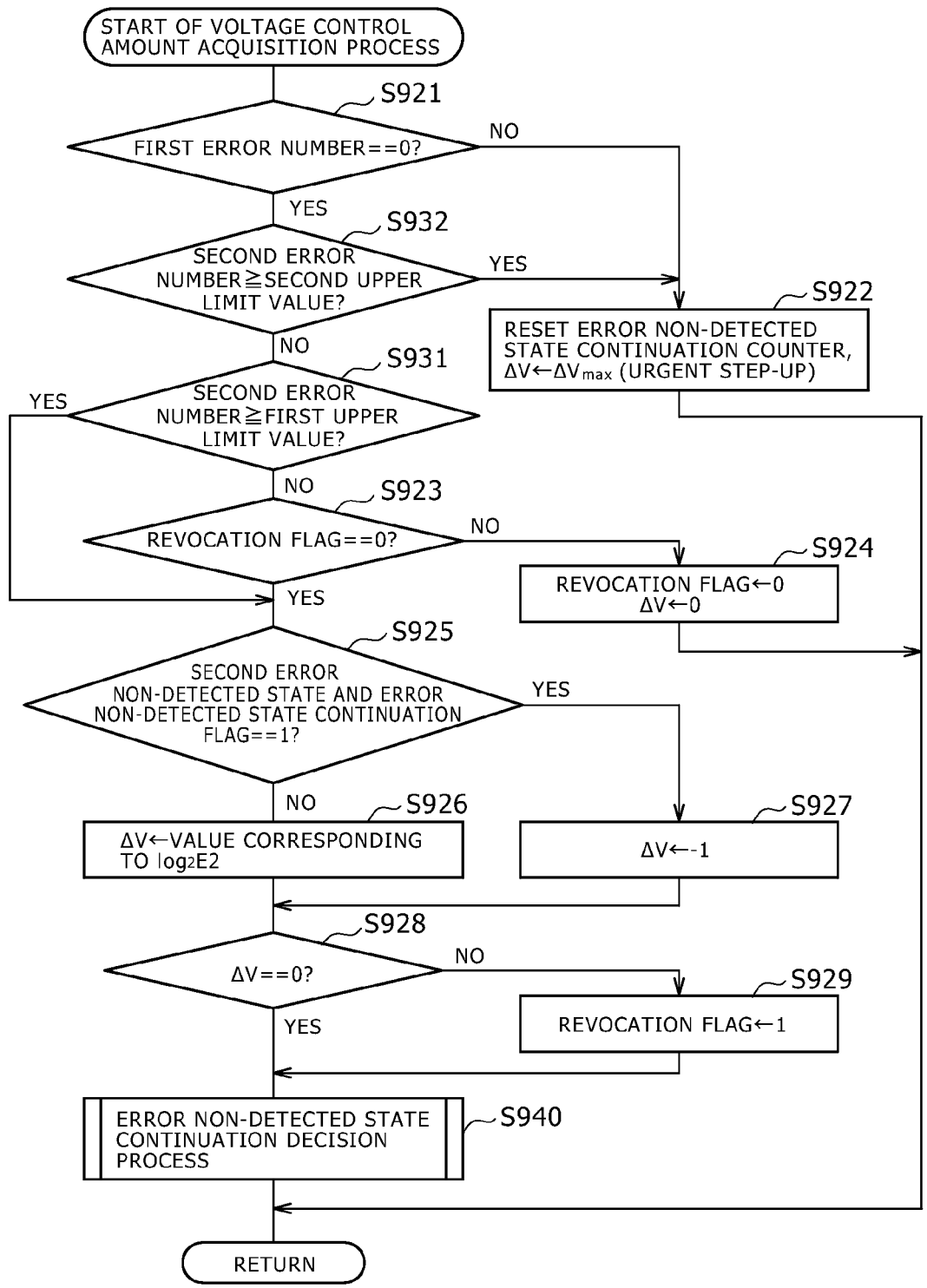
FIG. 30 is a flow chart illustrating an example of a voltage control amount acquisition process of the control amount outputting section shown in FIG. 29.

FIG. 30 is a flow chart illustrating an example of a voltage control amount acquisition process in the third embodiment. The voltage control amount acquisition process in the third embodiment is different from the voltage control amount acquisition process in the second embodiment in that processing at step S932 is executed additionally.

If the first error number is 0 (step S921: Yes), then the voltage control amount acquisition section 533 decides whether or not the second error number is equal to or higher than the second upper limit value (step S932). If the second error number is equal to or greater than the second upper limit value (step S932: Yes), then the voltage control amount acquisition section 551 attempts to carry out urgent step-up (step S922). On the other hand, if the second error number is smaller than the second upper limit value (step S932: No), the voltage control amount acquisition section 551 decides whether or not the second error number is equal to or greater than the second upper limit value (step S931).

A case in which it is known in advance that a first error can be generated if the second error number becomes equal to or greater than 10 is assumed. In this instance, when the second error number approaches 10, if a voltage control amount ΔV obtained from the voltage control amount conversion table 531 is outputted, then the possibility that a first error may occur cannot be lowered sufficiently. Therefore, some margin is provided such that the second upper limit value is set to 7. By this control, urgent step-up is carried out before a first error is generated, and consequently, occurrence of a first error is prevented.

Figure 31:
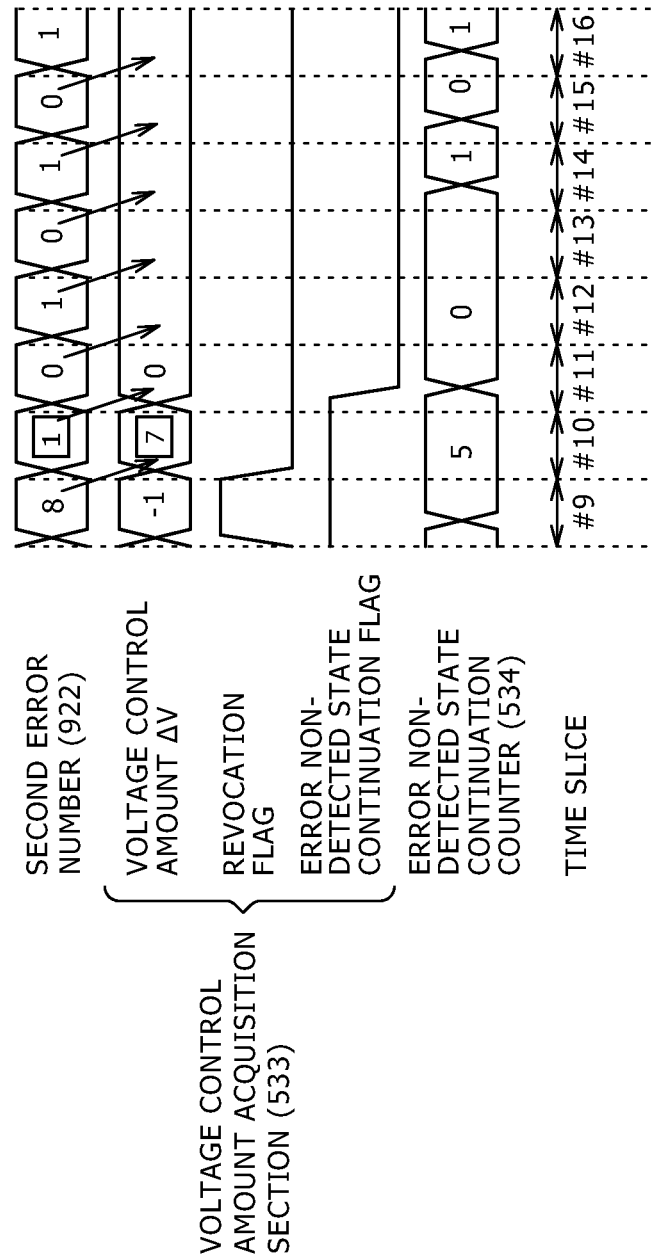
FIG. 31 is a timing chart illustrating an example of operation a voltage control amount arithmetic operation of the control amount outputting section shown in FIG. 29.

FIG. 31 illustrates an example of operation of the control amount arithmetic operation section 550 in the third embodiment. Since "−1" is outputted as the voltage control amount ΔV within the time slice #9, the revocation flag is set to 1. Within the next time slide #10, when the voltage control amount acquisition section 551 refers to the second error number which is "8," since the value referred to is equal to or higher than the second upper limit value, which is, for example, "7," the voltage control amount acquisition section 551 attempts to carry out urgent step-up irrespective of the value of the revocation flag. As a result, in the time slice #10, the second error number decreases to "1."

In this manner, in the third embodiment, the voltage control amount acquisition section 551 outputs, when the second error number is equal to or greater than the second upper limit value, a voltage control amount $\Delta V_{max}$ for stepping up the power supply voltage by a predetermined voltage. As a result, occurrence of a first error is prevented.

4. Fourth Embodiment

Configuration of the Information Processing Apparatus

Figure 32:
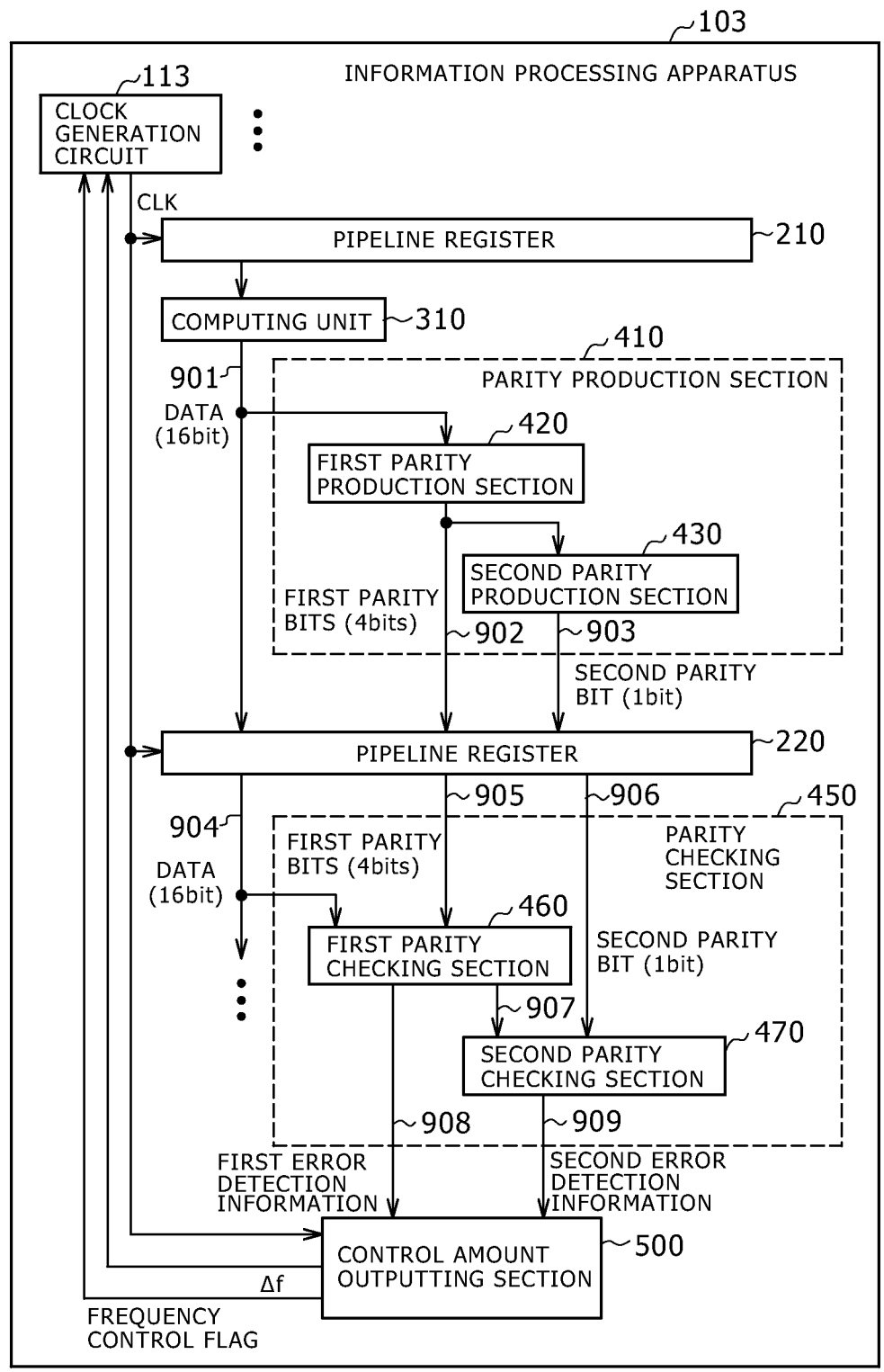
FIG. 32 is a block diagram showing an example of a configuration of an information processing system according to a fourth embodiment of the disclosed technology.

Now, a fourth embodiment of the disclosed technology is described with reference to FIGS. 32 to 36. FIG. 32 is a block diagram showing an example of a configuration of an information processing apparatus 103 according to the fourth embodiment. The configuration of the information processing apparatus 103 is different from that of the information processing apparatus 100 in the first embodiment in that it includes a clock generation circuit 113 and a control amount outputting section 503 in place of the clock generation circuit 110 and the control amount outputting section 500.

The control amount outputting section 503 is different from the control amount outputting section 500 in the first embodiment in that it outputs a frequency control flag and a frequency control amount Δf in place of the voltage control flag and the voltage control amount ΔV to the clock generation circuit 113. The frequency control flag is a signal for instructing the clock generation circuit 113 to add the frequency control amount Δf to the frequency of the clock signal CLK. The frequency control amount Δf is a control amount for controlling the frequency of the clock signal CLK. For example, the frequency control amount Δf is outputted as an increasing or decreasing value for the frequency of the base clock itself of the clock signal CLK or an increasing or decreasing value of a magnification for the base clock as a frequency control amount. The clock generation circuit 113 controls the frequency of the clock signal CLK by the frequency control amount.

Figure 33:
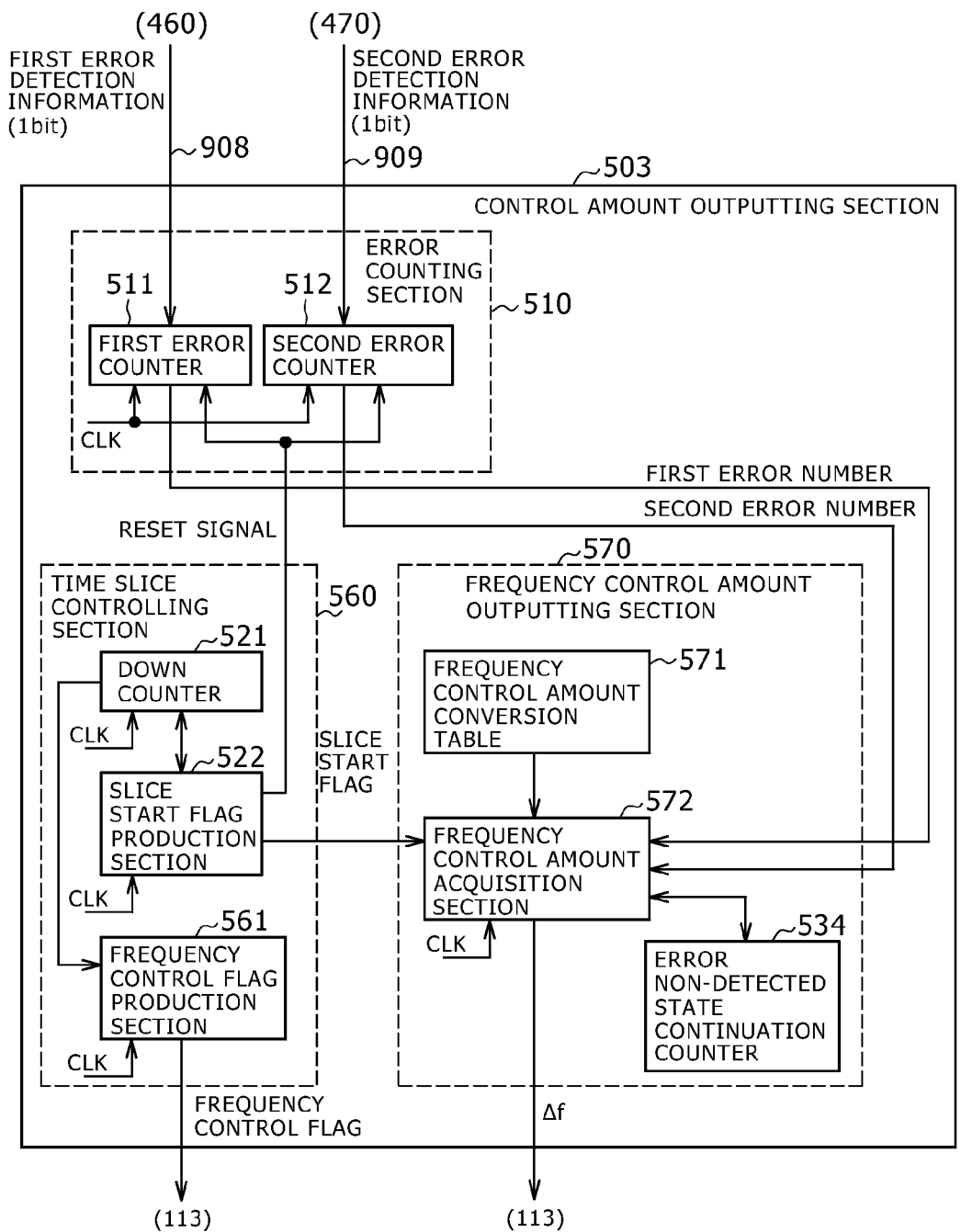
FIG. 33 is a block diagram showing an example of a configuration of a control amount outputting section of an information processing apparatus in the information processing system of FIG. 32.

FIG. 33 shows an example of a configuration of the control amount outputting section 503 in the fourth embodiment. Referring to FIG. 33, the configuration of the control amount outputting section 503 is different from that of the control amount outputting section 500 in the first embodiment in that it includes a time slice controlling section 560 and a frequency control amount outputting section 570 in place of the time slice controlling section 520 and the control amount arithmetic operation section 530. The time slice controlling section 560 is different from the time slice controlling section 520 in the first embodiment in that it includes a frequency control flag production section 561 in place of the voltage control flag production section 523.

The frequency control flag production section 561 produces a frequency control flag based on the counter value of the down counter 521, and the timing of starting of outputting of the frequency control flag is similar to the timing of starting of outputting of the voltage control flag. Meanwhile, as the output period of the frequency control flag, a period shorter than the output period of the voltage control flag is set.

The frequency control amount outputting section 570 includes a frequency control amount conversion table 571, a frequency control amount acquisition section 572 and an error non-detected state continuation counter 534.

The frequency control amount conversion table 571 stores the second error number and the frequency control amount Δf in an associated relationship with each other. The frequency when the second error number becomes equal to an allowance is determined in advance as a maximum operating frequency $f_{max}$. For each second error number, a frequency control amount Δf for controlling the corresponding frequency to the maximum operating frequency $f_{max}$ is stored in the frequency control amount conversion table 571 based on a relationship between the second error number and the frequency.

The frequency control amount acquisition section 572 acquires a frequency control amount Δf based on a first error number and a second error number. In particular, the frequency control amount acquisition section 572 executes a process for preventing a system error such as to carry out urgent step-down of a clock frequency if the rate of occurrence of first errors is higher than a first threshold value. If the rate of occurrence of first errors is equal to or lower than the first threshold value, then the frequency control amount acquisition section 572 decides whether or not the error non-detected state continues for a fixed period of time.

If the error non-detected state does not continue for the fixed period, then the frequency control amount acquisition section 572 acquires a frequency control amount Δf corresponding to the second error number from the frequency control amount conversion table 571 and outputs the acquired frequency control amount Δf to the clock generation circuit 113.

On the other hand, if the error non-detected state continues for the fixed period, then the frequency control amount acquisition section 572 outputs a frequency control amount Δf for increasing the frequency by a predetermined frequency.

The configuration of the error non-detected state continuation counter 534 in the fourth embodiment is similar to that of the error non-detected state continuation counter 534 in the first embodiment.

Operation of the Information Processing Apparatus

Figure 34:
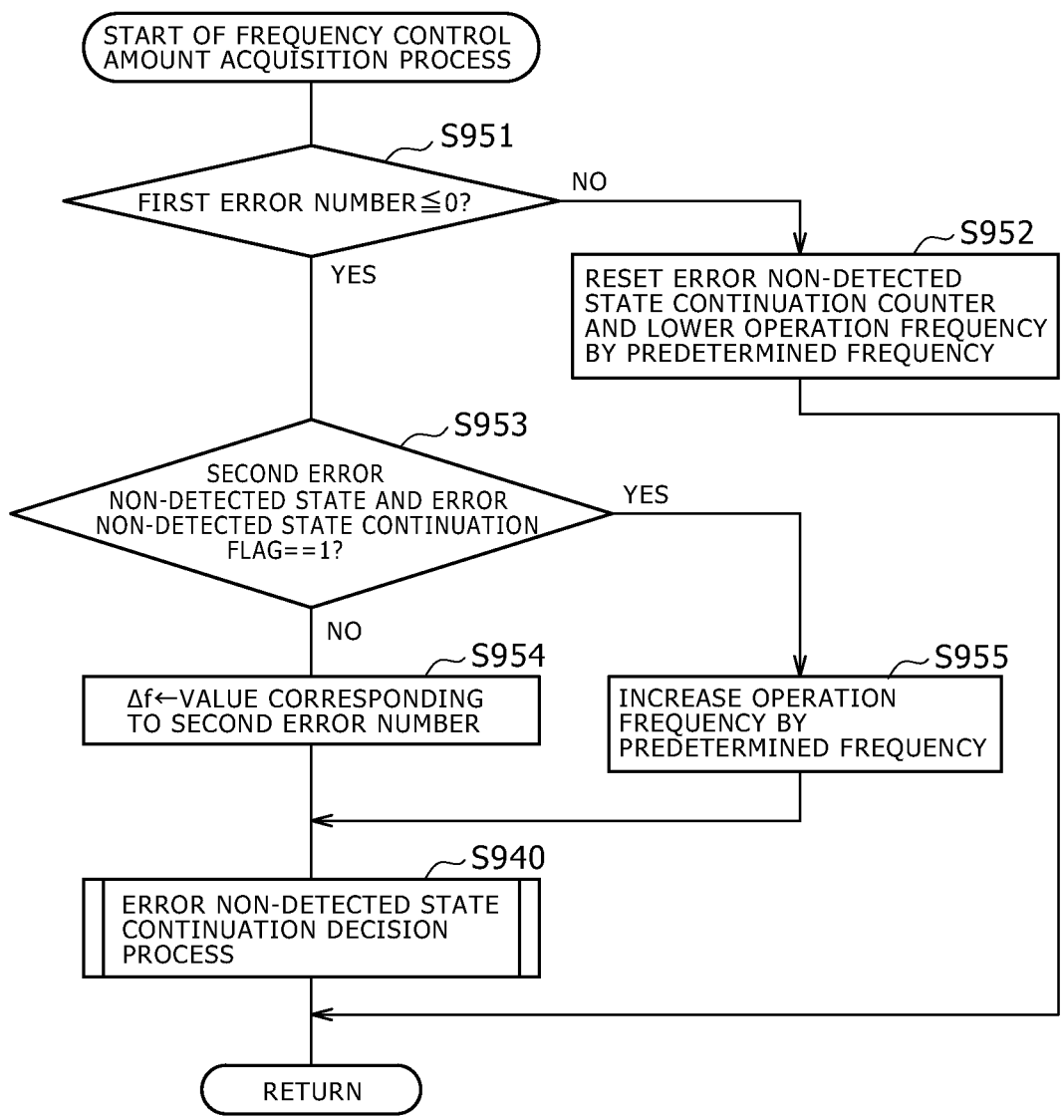
FIG. 34 is a flow chart illustrating an example of a frequency control amount acquisition process of the control amount outputting section of FIG. 33.

Operation of the information processing apparatus 103 in the fourth embodiment is described with reference to FIG. 34. FIG. 34 is a flow chart illustrating an example of a frequency control amount acquisition process in the fourth embodiment.

The frequency control amount acquisition section 572 decides whether or not the counted first error number is 0 (step S951). If the first error number is not 0 (step S951: No), then the frequency control amount acquisition section 572 resets the error non-detected state continuation counter 534. Further, the frequency control amount acquisition section 572 outputs a frequency control amount Δf to lower the operation frequency (step S952).

On the other hand, if the first error number is 0 (step S951: Yes), then the frequency control amount acquisition section 572 decides whether or not a non-detected state of a second error is found and the error non-detected state continuation flag is 1 (step S953).

If a second error is detected or the error non-detected state continuation flag is 0 (step S953: No), then the frequency control amount acquisition section 572 reads out a value corresponding to the second error number from the frequency control amount conversion table 571. The frequency control amount acquisition section 572 outputs the read out value as the frequency control amount Δf (step S954).

If a second error is not detected as yet and the error non-detected state continuation flag is 1 (step S953: Yes), then the frequency control amount acquisition section 572 reads out the frequency control amount Δf for increasing the operation frequency by a predetermined frequency (step S955).

After step S954 or S955, the frequency control amount acquisition section 572 executes an error non-detected state continuation decision process (step S940). The error non-detected state continuation decision process in the fourth embodiment is similar to that in the first embodiment. After step S952 or S940, the frequency control amount acquisition section 572 ends the frequency control amount acquisition process.

Figure 35:
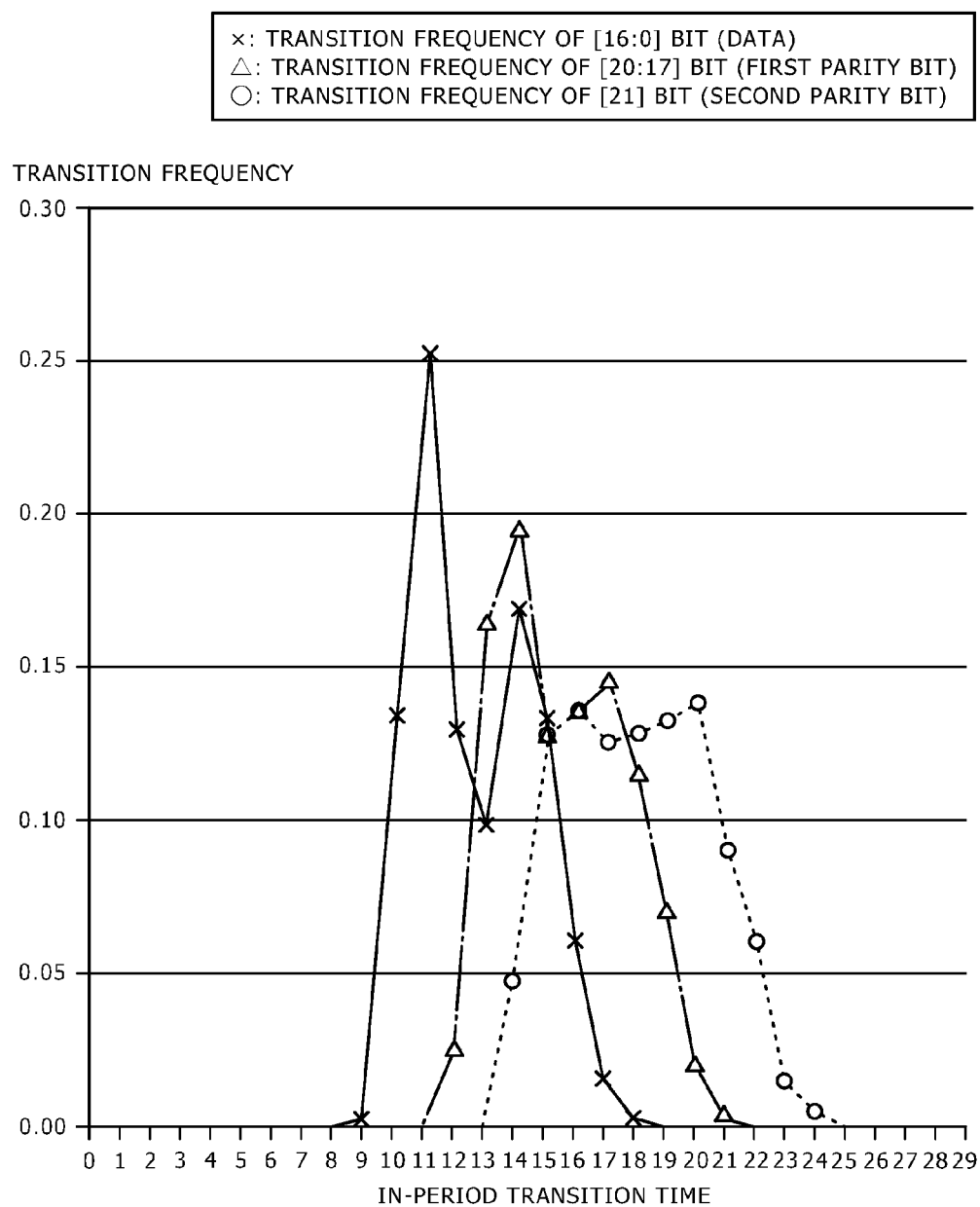
FIG. 35 is a graph illustrating a relationship between a transition frequency and in-period transition time in the information processing system of FIG. 32.

A relationship between the frequency and the error rate of occurrence is described with reference to FIG. 35. FIG. 35 is a graph illustrating a relationship between the transition frequency and the in-period transition time in the fourth embodiment. In FIG. 35, the axis of ordinate indicates the transition frequency of data, and the axis of abscissa indicates the in-period transition time. The in-period transition time is time at which, when arithmetic operation is executed in synchronism with a clock signal, data transits within a period of the clock signal. In other words, the in-period transition time is time at which transition of data is delayed with respect to a transition timing of the clock signal. The transition frequency is a value obtained by executing arithmetic operation by a plural number of times for data while measuring time at which data transits, that is, in-period transition time, in each arithmetic operation and dividing the number of times of transition for each time by the number of times of arithmetic operation. For example, if arithmetic operation is carried out 1000 times and the number of times by which data transits at the in-period transition time 9 is 10, then the transition frequency at the in-period transition time 9 is 0.01.

In the graph of FIG. 35, "x" represents a plotted point of a transition frequency of data of 16 bits of a result of arithmetic operation. "Δ" represents a plotted point of the transition frequency of a first parity bit produced from the data of 16 bits. "○" represents a plotted point of the transition frequency of a second parity bit produced from first parity bits.

As seen from FIG. 35, a transition timing of a first parity bit represented by "Δ" which is produced from data is delayed with respect to a transmission timing of the data represented by "x." A transition timing of a second parity bit represented by "○" which is produced from the first parity bit is delayed further with respect to the transition timing of the first parity bit represented by "Δ."

If the operation frequency is raised, then the transition of the second parity bit which exhibits the longest delay time fails to be produced in time, and the rate of occurrence of a second error increases. While, in FIG. 35, the transition frequency of a second parity bit is 0 at the in-period transition time "25," the transition frequency is greater than 0 at the in-period transition time "26." Therefore, if the frequency is increased until a period corresponding to the in-period transition time "25" is reached, then the second error number further increases together with the increase of the frequency, and also the probability of occurrence of first errors increases. For example, at the in-period transition time "21," the transition frequency of first parity bits is higher than 0. Therefore, if the frequency is increased until a frequency corresponding to the in-period transition time "21" is reached, then a first error begins to be produced.

Based on the relationship described above, determining a frequency when the second error value becomes an allowable value as the maximum operation frequency $f_{max}$, for each of the second error numbers, the frequency control amount Δf for controlling the frequency corresponding to the second error number to the maximum operating frequency $f_{max}$ is determined.

In this manner, according to the fourth embodiment, when the rate of occurrence of first errors is equal to or lower than the first threshold value, the information processing apparatus 103 outputs a frequency control amount for controlling the frequency with the second threshold value set as a target value to the rate of occurrence of second errors. According to this configuration, a timing violative error which cannot be detected by a check in which a first parity bit is used can be detected using a second parity bit. Accordingly, by outputting a frequency control amount for controlling the rate of occurrence of second errors detected by using the second parity bit to the second threshold value, occurrence of a timing violative error can be prevented. The information processing apparatus 103 need not include a special flip-flop as in the case of an EDS and a TRC or a TD circuit. Therefore, the information processing apparatus 103 can be configured in a comparatively small circuit scale. Further, the information processing apparatus 103 can detect, in addition to a timing violative error, also errors other than a timing violative error from the first parity bit. Accordingly, an accurate frequency with which no malfunction occurs can be set readily.

It is to be noted that, in the case of a circuit in which an exponential relationship is observed between the frequency and the rate of occurrence of second errors, a logarithm arithmetic operation section may be provided similarly as in the first embodiment such that a frequency control amount corresponding to the logarithm of a second error number is read out from a conversion table.

Further, while, in the first to fourth embodiments, the allowance for the first error number is 0, naturally a value higher than 0 may be set as the allowance. For example, at step S951 of FIG. 34, the frequency control amount acquisition section 572 may decide whether or not the first error number is lower than an integer ERR_LIMIT which is greater than 0.

The processing procedure described hereinabove in connection with the preferred embodiments of the disclosed technology may be grasped as a method which includes the series of steps or may be grasped as a program for causing a computer to execute the series of steps or a recording medium in or on which the program is stored. The recording medium may be, for example, a CD (Compact Disc), an MD (Mini Disc), a DVD (Digital Versatile Disk), a memory card, a blue ray disk (Blu-ray disc (registered trademark) or the like.

The present technology contains subject matter related to that disclosed in Japanese Priority Patent Application JP 2011-077214 filed in the Japan Patent Office on Mar. 31, 2011, the entire content of which is hereby incorporated by reference.

While preferred embodiments of the disclosed technology have been described using specific terms, such description is for illustrative purpose only, and it is to be understood that changes and variations may be made without departing from the spirit or scope of the following claims.

What is claimed is:

1. An information processing apparatus, comprising:
a first retention section configured to retain and output data in accordance with a clock signal;
a processing section configured to process the outputted data and output the data as processed data;
a first error detection code production section configured to produce a first error detection code for detecting an error of the processed data from the processed data;
a second error detection code production section configured to produce a second error detection code for detecting an error of the processed data from the first error detection code;
a second retention section configured to retain the processed data and the first and second error detection codes therein in accordance with the clock signal;
a first error detection section configured to detect an error of the retained processed data as a first error using the retained first error detection code;
a second error detection section configured to detect an error of the retained processed data as a second error using the retained second error detection code; and
a control amount outputting section configured to control, when an occurrence rate of the first error in said first error detection section is equal to or lower than a first threshold value while an occurrence rate of the second error in said second error detection section is higher than a second threshold value, a power supply voltage to said processing section or a frequency of the clock signal using the second threshold value as a target value for the occurrence rate of the second error based on a predetermined relationship between the occurrence rate of the second error and the power supply voltage or the frequency.

2. The information processing apparatus according to claim 1, wherein said control amount outputting section includes:
a first error counting section configured to count the number of first errors detected within an error detection unit period;
a second error counting section configured to count the number of second errors detected within the error detection unit period; and
a control amount production section configured to produce a control amount based on the predetermined relationship when the occurrence rate of the first error obtained from the number of first errors counted within the error detection unit period is equal to or lower than the first threshold value and the occurrence rate of the second error obtained from the number of the second errors counted within the error detection unit period is higher than the second threshold value.

3. The information processing apparatus according to claim 2, wherein the control amount is used for the power supply voltage; and
said control amount production section includes:
a conversion table in which the control amount obtained from the predetermined relationship is associated with a logarithm of the number of the second errors detected within the error detection unit period;
a logarithm arithmetic operation section configured to arithmetically operate the logarithm of the number of the second errors counted within the error detection unit; and
a voltage control amount acquisition section configured to acquire, when the occurrence rate of the first error obtained from the number of the first errors counted within the error detection unit period is equal to or lower than the first threshold value and the occurrence rate of the second error obtained from the number of the second errors counted within the error detection unit period is higher than the second threshold value, the control amount corresponding to the logarithm arithmetically operated by said logarithm arithmetic operation section from said conversion table.

4. The information processing apparatus according to claim 3, wherein said logarithm arithmetic operation section outputs a value obtained by subtracting 1 from a value at the most significant digit from among bits of 1 in a bit string in which the number of the second errors is represented by a binary notation.

5. The information processing apparatus according to claim 2, wherein the control amount is used for the power supply voltage; and
said control amount production section produces the control amount for each error detection unit period and produces the control amount within the present operation cycle based on the predetermined relationship if the control amount produced within the immediately preceding operation cycle is zero within each error detection unit period.

6. The information processing apparatus according to claim 5, wherein, when the occurrence rate of the second error is equal to or higher than a first upper limit value or when the control amount produced within the immediately preceding operation cycle is zero, said control amount production section produces the control amount within the present operation cycle based on the predetermined relationship.

7. The information processing apparatus according to claim 6, wherein, when the occurrence rate of the second error is equal to or higher than a second upper limit value which is higher than the first upper limit value, said control amount production section produces the control amount for stepping up the power supply voltage by a predetermined voltage.

8. The information processing apparatus according to claim 1, wherein the control amount is used for the power supply voltage; and
said control amount outputting section outputs the control amount for stepping up the power supply voltage by a predetermined voltage if the occurrence rate of the first error is higher than the first threshold value.

9. The information processing apparatus according to claim 1, wherein the control amount is used for the power supply voltage; and
said control amount outputting section outputs the control amount for stepping down the power supply voltage by a predetermined voltage if, within a longer period than a predetermined decision reference period, the occurrence rate of the first error is equal to or lower than the first threshold value and the occurrence rate of the second error is equal to or lower than the second threshold value.

10. The information processing apparatus according to claim 1, wherein the control amount is used for the frequency; and
said information processing apparatus further comprises a clock generation circuit configured to generate the clock signal whose frequency is set in accordance with the control amount.

11. The information processing apparatus according to claim 10, wherein said controlling output section outputs the control amount for decreasing the frequency by a predetermined frequency if the occurrence rate of the first error is higher than the first threshold value.

12. The information processing apparatus according to claim 10, wherein said control amount outputting section outputs the control amount for stepping up the frequency by a predetermined frequency if, within a longer period than a predetermined decision reference period, the occurrence rate of the first error is equal to or lower than the first threshold value and the occurrence rate of the second error is equal to or lower than the second threshold value.

13. An information processing system, comprising:
an information processing apparatus including a first retention section configured to retain and output data in accordance with a clock signal, a processing section configured to process the outputted data and output the data as processed data, a first error detection code production section configured to produce a first error detection code for detecting an error of the processed data from the processed data, a second error detection code production section configured to produce a second error detection code for detecting an error of the processed data from the first error detection code, a second retention section configured to retain the processed data and the first and second error detection codes in accordance with the clock signal, a first error detection section configured to detect an error of the retained processed data as a first error using the retained first error detection code, a second error detection section configured to detect an error of the retained processed data as a second error using the retained second error detection code and a control amount outputting section configured to control, when an occurrence rate of the first error by said first error detection section is equal to or lower than a first threshold value while an occurrence rate of the second error by said second error detection section is higher than a second threshold value, a control amount for controlling a power supply voltage to said processing section or a frequency of the clock signal taking the second threshold value as a target value for the occurrence rate of the second error based on a predetermined relationship between the occurrence rate of the second error and the power supply voltage or the frequency; and
a power supply apparatus configured to supply the power supply voltage to said information processing apparatus and control the power supply voltage based on the outputted control amount.

14. A controlling method for an information processing apparatus, comprising:
producing a first error detection code for detecting an error of processed data processed by a processing section from the processed data;
producing a second error detection code for detecting an error of the processed data from the first error detection code;
detecting, using the first error detection code retained in a retention section for retaining the processed data and the first and second error detection codes in accordance with a clock signal, an error of the retained processed data as a first error;
detecting an error of the retained processed data as a second error using the retained second error detection code; and
controlling, when an occurrence rate of the first error by a first error detection section is equal to or lower than a first threshold value while an occurrence rate of the second error by a second error detection section is higher than a second threshold value, a control amount for controlling a power supply voltage to said processing section or a frequency of the clock signal using the second threshold value as a target value for the occurrence rate of the second error based on a predetermined relationship between the occurrence rate of the second error and the power supply voltage or the frequency.

15. A non-transitory computer readable medium storing instructions that are executable by a processor to perform operations comprising:
a first error detection code production step of producing a first error detection code for detecting an error of processed data processed by a processing section from the processed data;
a second error detection code production step of producing a second error detection code for detecting an error of the processed data from the first error detection code;
a first error detection step of detecting, using the first error detection code retained in a retention section for retaining the processed data and the first and second error detection codes in accordance with a clock signal, an error of the retained processed data as a first error;
a second error detection step of detecting an error of the retained processed data as a second error using the retained second error detection code; and
a control amount outputting step of controlling, when an occurrence rate of the first error by a first error detection section is equal to or lower than a first threshold value while an occurrence rate of the second error by a second error detection section is higher than a second threshold value, a control amount for controlling a power supply voltage to the processing section or a frequency of the clock signal using the second threshold value as a target value for the occurrence rate of the second error based on a predetermined relationship between the occurrence rate of the second error and the power supply voltage or the frequency.

16. The computer-readable medium of claim 15, wherein the operation further comprise:
    counting, by a first error counting section, the number of first errors detected within an error detection unit period;
    counting, by a second error counting section, the number of second errors detected within the error detection unit period; and
    producing, by a control amount production section, a control amount based on the predetermined relationship when the occurrence rate of the first error obtained from the number of first errors counted within the error detection unit period is equal to or lower than the first threshold value and the occurrence rate of the second error obtained from the number of the second errors counted within the error detection unit period is higher than the second threshold value.

17. The computer readable medium according to claim 16, wherein the control amount is used for the power supply voltage; and
    said control amount production section includes:
        a conversion table in which the control amount obtained from the predetermined relationship is associated with a logarithm of the number of the second errors detected within the error detection unit period;
        a logarithm arithmetic operation section configured to arithmetically operate the logarithm of the number of the second errors counted within the error detection unit; and
        wherein a voltage control amount acquisition section acquires, when the occurrence rate of the first error obtained from the number of the first errors counted within the error detection unit period is equal to or lower than the first threshold value and the occurrence rate of the second error obtained from the number of the second errors counted within the error detection unit period is higher than the second threshold value, the control amount corresponding to the logarithm arithmetically operated by said logarithm arithmetic operation section from said conversion table.

18. The computer readable medium according to claim 17, wherein said logarithm arithmetic operation section outputs a value obtained by subtracting 1 from a value at the most significant digit from among bits of 1 in a bit string in which the number of the second errors is represented by a binary notation.

19. The computer readable medium according to claim 16, wherein the control amount is used for the power supply voltage; and
    said control amount production section produces the control amount for each error detection unit period and produces the control amount within the present operation cycle based on the predetermined relationship if the control amount produced within the immediately preceding operation cycle is zero within each error detection unit period.

20. The computer readable medium according to claim 19, wherein, when the occurrence rate of the second error is equal to or higher than a first upper limit value or when the control amount produced within the immediately preceding operation cycle is zero, said control amount production section produces the control amount within the present operation cycle based on the predetermined relationship.

* * * * *